United States Patent
Masuoka et al.

(10) Patent No.: US 7,009,888 B2
(45) Date of Patent: Mar. 7, 2006

(54) LOW VOLTAGE, ISLAND-LAYER-BASED NONVOLATILE SEMICONDUCTOR STORAGE DEVICE WITH FLOATING BIASED MEMORY CELL CHANNEL

(75) Inventors: Fujio Masuoka, Sendai (JP); Hiroshi Sakuraba, Sendai (JP); Fumiyoshi Matsuoka, Sendai (JP); Syounosuke Ueno, Fujiidera (JP); Ryusuke Matsuyama, Nara (JP); Shinji Horii, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/888,693

(22) Filed: Jul. 8, 2004

(65) Prior Publication Data

US 2005/0012134 A1    Jan. 20, 2005

(30) Foreign Application Priority Data

Jul. 15, 2003    (JP)    ............................. 2003-197409

(51) Int. Cl.
    *G11C 16/12*    (2006.01)
(52) U.S. Cl. ........................... 365/185.28; 365/185.27; 365/185.26; 365/185.18
(58) Field of Classification Search ........... 365/185.17, 365/185.18, 185.28, 185.27, 185.26
    See application file for complete search history.

(56) References Cited

U.S. PATENT DOCUMENTS

| 4,451,905 | A | * | 5/1984 | Moyer | .................. | 365/185.02 |
| 5,117,392 | A | * | 5/1992 | Harada | .................. | 365/185.21 |
| 5,436,552 | A | * | 7/1995 | Kajimoto | .................. | 323/313 |
| RE37,311 | E | * | 8/2001 | Kato et al. | ............. | 365/185.27 |
| 6,643,210 | B1 | * | 11/2003 | Yamano | ................ | 365/230.03 |

FOREIGN PATENT DOCUMENTS

| JP | 04-079369 | 3/1992 |
| JP | 2002-057231 | 2/2002 |

* cited by examiner

*Primary Examiner*—Andrew Q. Tran
(74) *Attorney, Agent, or Firm*—Morrison & Foerster LLP

(57) ABSTRACT

A method for driving a nonvolatile memory device including a semiconductor substrate, an island semiconductor layer on the substrate, a memory cell having a control gate and a charge storage layer surrounding a peripheral surface of the island semiconductor layer, a first selection transistor provided between the memory cell and the substrate and having a first selection gate, a source diffusion layer between the substrate and the island semiconductor layer, a drain diffusion layer provided in an opposing end of the island semiconductor layer from the source diffusion layer, and a second selection transistor provided between the memory cell and the drain diffusion layer and having a second selection gate, the method comprising the steps of: applying a negative first voltage to the drain and the first selection gate, applying a positive second voltage to the second selection gate, and applying 0V or a positive third voltage to the source; and applying a positive fourth voltage higher than the second voltage to the control gate of the memory cell for injecting electric charges into the charge storage layer.

12 Claims, 35 Drawing Sheets

LOW VOLTAGE, ISLAND-LAYER-BASED NONVOLATILE SEMICONDUCTOR STORAGE DEVICE WITH FLOATING BIASED MEMORY CELL CHANNEL

CROSS-REFERENCE TO RELATED APPLICATION

This application is related to Japanese application No.2003-197409 filed on Jul. 15, 2003 whose priority is claimed under 35 USC §119, the disclosure of which is incorporated by reference in its entirety.

BACKGROUND OF THE INVENTION

1. Field of the Invention

The present invention relates to a nonvolatile memory device driving method, a semiconductor storage device, and a liquid crystal display device including the semiconductor storage device.

2. Description of the Related Art

There is known a flash memory whose memory cells each include a control gate and a charge storage layer and have a MOS transistor structure in which electric charges are injected into and released from the charge storage layer by utilizing an FN tunnel current. Data "0" and "1" are stored according to a difference in threshold voltage attributable to a difference in the charge storage state of the charge storage layer. In the case of an N-channel memory cell having a floating gate as the charge storage layer, for example, a high voltage is applied to the control gate, and a drain diffusion layer, a source diffusion layer and a semiconductor substrate are grounded for the injection of electric charges into the floating gate. At this time, the electric charges are injected into the floating gate from the substrate by the FN tunnel current.

Thus, the threshold voltage of the memory cell is positively shifted by the injection of the electric charges. For the release of the electric charges from the floating gate, on the other hand, a negative voltage is applied to the control gate, and the drain diffusion layer, the source diffusion layer and the substrate are grounded. At this time, the electric charges are released from the floating gate to the substrate by the FN tunnel current. Thus, the threshold voltage of the memory cell is negatively shifted by the release of the electric charges.

In the aforesaid operation, the ratio (coupling ratio) between a floating gate/control gate coupling capacitance and a floating gate/substrate coupling capacitance is important for efficiently achieving the charge injection and the charge release, i.e., for the writing and the erasing. As the capacitance between the floating gate and the control gate is increased, the potential of the control gate can more effectively be transferred to the floating gate, thereby facilitating the writing and the erasing.

With the recent progress of the semiconductor technology, particularly the micro-processing technology, the size reduction and capacity increase of memory cells of nonvolatile memory devices are rapidly promoted. Therefore, how to reduce the area of the memory cells and how to increase the capacitance between the floating gate and the control gate are critical issues. In order to increase the capacitance between the floating gate and the control gate, it is necessary to reduce the thickness of a gate insulation film provided between the floating gate and the control gate, to increase the dielectric constant of the gate insulation film, or to increase the area of opposed surfaces of the floating gate and the control gate. However, the thickness reduction of the gate insulation film has limitation in consideration of the reliability. A conceivable approach to the increase of the dielectric constant of the gate insulation film is to employ a silicon nitride film or the like instead of a silicon oxide film. However, this approach poses a problem associated with the reliability and, hence, is not practical. Therefore, it is necessary to increase an overlap between the floating gate and the control gate to not smaller than a predetermined area in order to provide a sufficient capacitance. However, this is contradictory to the reduction of the area of the memory cells for the increase of the storage capacity of the nonvolatile memory device.

On the other hand, a nonvolatile memory device as shown in FIG. 7 is known (see, for example, Japanese Unexamined Patent Publication No. Hei 4-79369 (1992)). In the nonvolatile memory device shown in FIG. 7, memory cells are constructed by utilizing peripheral walls of a plurality of island semiconductor layers 12 arranged in a sea-island configuration or a plurality of island semiconductor layers 12 arranged in a matrix configuration and isolated from each other by a lattice trench formed in a semiconductor substrate 13. The island semiconductor layers 12 are each formed with two memory cells, and selection transistors are provided above and below the memory cells. The memory cells are constituted by a drain diffusion layer 7 provided as a drain in an upper surface of the island semiconductor layer, a common source diffusion layer 11 provided as a source in a bottom of the trench, and charge storage layers 1, 3 and control gates 2, 4 entirely surrounding the peripheral surface of the island semiconductor layer 12. A control gate line is provided along each row of island semiconductor layers 12 serially arranged and connected to the control gates 2, 4. A bit line is provided as intersecting the control gate line and connected to the drain diffusion layers 7 of a plurality of such nonvolatile memory devices.

In the memory cell structure shown in FIG. 7, the selection transistors each include a selection gate electrode 5, 6 which at least partly surrounds the peripheral surface of the island semiconductor layer 12 and is connected in series to the memory cells so as to prevent an electric current from flowing into unselected cells even if the memory cells are over-erased (with a read voltage of 0V and a negative threshold). Thus, the aforesaid problem can assuredly be eliminated.

It is herein assumed that memory cells connected in series on each of the island semiconductor layers as shown in FIG. 7 have the same threshold voltage in the non-volatile memory device. Here, a reading operation is performed by applying a read potential sequentially to control gate lines (CG) of the memory cells for determination of "0" or "1" depending on the presence or absence of the electric current. If the electric current flowing through the semiconductor layer causes a potential difference between the memory cells connected in series on the single island semiconductor layer due to a resistant component of the semiconductor layer at this time, the potential difference makes the threshold voltages of the respective memory cells non-uniform (back bias effect). The back bias effect limits the number of memory cells to be connected in series, thereby hampering the attempt at the increase of the capacitance. Further, the back bias effect may occur not only where a plurality of devices are connected in series on the single island semiconductor layer, but also where a single memory cell is provided in the single island semiconductor layer. That is, where the back bias effect varies depending on the position on the semiconductor substrate, the threshold voltages of the respective memory cells are liable to be non-uniform. If the threshold voltages are non-uniform depending on the positions of the memory cells, the write/erase/read voltages for the writing, erasing and reading operations with respect to the memory cells are liable to be non-uniform, resulting in adverse effects such as variations in the characteristics of the memory devices.

To solve the problem associated with the back bias effect of the substrate, an improved arrangement is proposed in which island semiconductor layers are electrically isolated from a semiconductor substrate (see, for example, Japanese Unexamined Patent Publication No. 2002-57231). By thus electrically isolating the island semiconductor layers from the semiconductor substrate, the back bias effect can be suppressed. Thus, a nonvolatile memory device having an improved integration density is provided, in which the coupling ratio of the floating gate/control gate coupling capacitance is further increased without increasing the area of the memory cells, and the variations in cell characteristics attributable to the production process are suppressed.

From another viewpoint, it is desirable to reduce voltages to be applied to the drain, the source and the control gate of the flash memory cell for the injection of the electric charges into the charge storage layer of the memory cell (for the writing operation) as much as possible. If a low-voltage operation is possible, there is no need to increase the gate width and length of a transistor in a decoder circuit involved in the operation of the memory cell to ensure a proper breakdown voltage and a proper driving current. Further, the reduction of the voltages to be applied for the writing operation makes it possible to reduce the size of a booster circuit provided in the chip. Thus, the size reduction of the decoder transistor and the booster circuit can be achieved, so that the area of the chip can be reduced.

One exemplary method for reducing the gate width and length of the decoder transistor is to reduce the magnitude of the voltage to be applied to the control gate while ensuring a proper potential difference between the control gate and the channel by applying a negative voltage to the drain. In the flash memory cell having the prior art structure, however, the application of the negative voltage to the drain forwardly biases a junction of the P-type semiconductor substrate (ground), resulting in an overcurrent. Therefore, the simple application of the negative voltage is impractical. A known approach to this is to provide the memory cell in a triple well structure, i.e., to form an N-well layer in the P-type semiconductor substrate and provide the memory cell in the N-well layer, for electrical isolation from the semiconductor substrate. However, this approach is disadvantageous in that the production process is complicated.

As described above, it is desirable that the voltages to be applied to the drain diffusion layer, the source diffusion layer and the control gates of the memory cells are reduced as much as possible in the nonvolatile memory device provided in association with the island semiconductor layer for the size reduction and the capacitance increase of the memory cells. Therefore, it is preferred to reduce the magnitude of the voltage to be applied to the control gates while ensuring a proper potential difference between the control gates and the channels by applying a negative voltage to the drain diffusion layer. In the prior art device structure shown in FIG. 7, however, the application of the negative voltage to the drain diffusion layer 7 forwardly biases a junction of the P-type semiconductor layer 12 (ground). Therefore, the simple application of the negative voltage is impractical. The provision of the triple well structure for the memory cells is a conceivable approach. In practice, however, the provision of the triple well structure in a lower portion of the P-type semiconductor layer 12 requires a more complicated production process than the prior art flash memory.

SUMMARY OF THE INVENTION

In view of the foregoing, the present invention is directed to a method for driving a nonvolatile memory device provided in association with an island semiconductor layer and less susceptible to the back bias effect. More specifically, the invention is directed to a nonvolatile memory device driving method in which the magnitude of a write voltage is reduced by controlling a selection transistor of the memory device without complicating the structure of the nonvolatile memory device.

According to the present invention, there is provided a method for driving a nonvolatile memory device which comprises a semiconductor substrate, at least one island semiconductor layer provided on the semiconductor substrate, at least one memory cell having a control gate and a charge storage layer partly or entirely surrounding a peripheral surface of the island semiconductor layer, a first selection transistor provided between the memory cell and the semiconductor substrate and having a first insulation layer and a first selection gate, a source diffusion layer provided as a source between the semiconductor substrate and the island semiconductor layer provided with the memory cell and the first selection transistor for electrically isolating the island semiconductor layer from the semiconductor substrate, a drain diffusion layer provided as a drain in an end surface of the island semiconductor layer opposite from the source diffusion layer with respect to the memory cell, and a second selection transistor provided between the memory cell and the drain diffusion layer and having a second insulation layer and a second selection gate, the method comprising the steps of: applying a negative first voltage to the drain and the first selection gate, applying a positive second voltage to the second selection gate, and applying 0V or a positive third voltage to the source; and applying a positive fourth voltage higher than the second voltage to the control gate of the memory cell for injecting electric charges into the charge storage layer.

According to the present invention, the electric charges are injected into the charge storage layer of the nonvolatile memory device for a writing operation by applying the negative first voltage to the drain while applying 0V or the positive third voltage to the source and applying the negative first voltage to the first selection gate. Thus, the flow of an excessive electric current into the drain can be prevented without the need for the provision of the triple well structure which requires a complicated production process. In addition, the electric charges can be injected into the charge storage layer without applying a higher voltage to the control gate. Therefore, the gate width and length of the transistor in the decoder or the booster circuit in the chip can be reduced, thereby reducing the area of the chip.

DETAILED DESCRIPTION OF THE INVENTION

Figure 1:
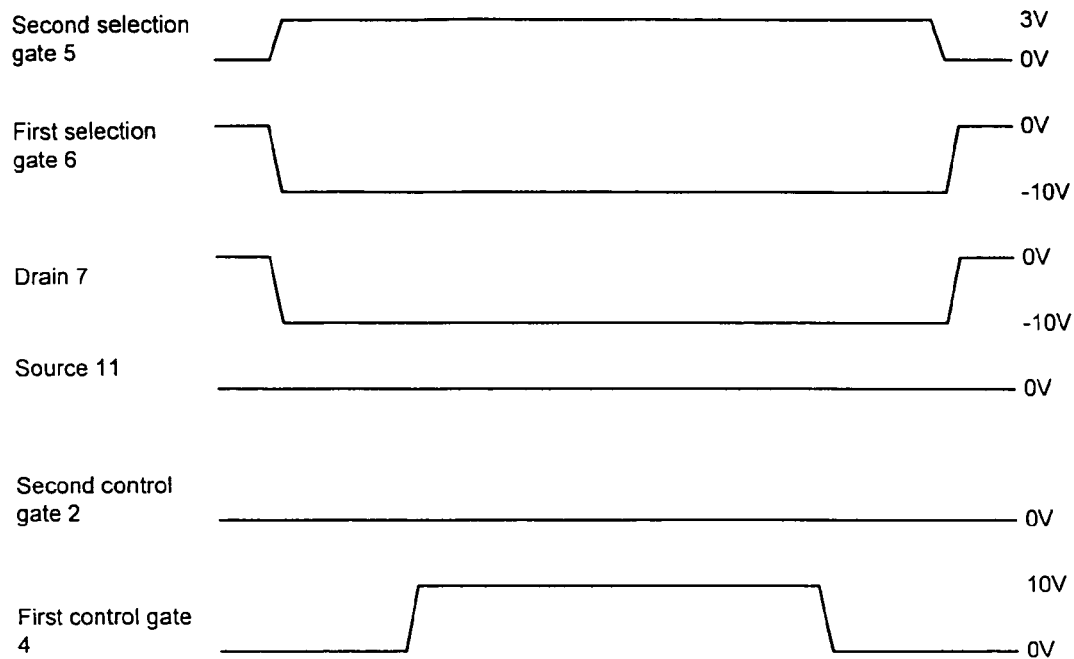
FIG. 1 is a timing chart for the application of the voltages to the respective terminals of a nonvolatile memory device according to the present invention.

A nonvolatile memory device according to the present invention principally comprises: a semiconductor substrate; at least one island semiconductor layer provided on the semiconductor substrate; at least one memory cell having a control gate and a charge storage layer partly or entirely surrounding a peripheral surface of the island semiconductor layer; a first selection transistor provided between the memory cell and the semiconductor substrate and having a first insulation layer and a first selection gate; a source diffusion layer provided as a source between the semiconductor substrate and the island semiconductor layer provided with the memory cell and the first selection transistor for electrically isolating the island semiconductor layer from the semiconductor substrate; a drain diffusion layer provided as a drain in an end surface of the island semiconductor layer opposite from the source diffusion layer with respect to the memory cell; and a second selection transistor provided between the memory cell and the drain diffusion layer and having a second insulation layer and a second selection gate.

According to one inventive aspect, there is provided a method for driving the nonvolatile memory device, which comprises the steps of: applying a negative first voltage to the drain and the first selection gate, applying a positive second voltage to the second selection gate, and applying 0V or a positive third voltage to the source; and applying a positive fourth voltage higher than the second voltage to the control gate of the memory cell for injecting electric charges into the charge storage layer.

The nonvolatile memory device driving method may further comprise the steps of: applying a positive fifth voltage to the drain, applying a positive sixth voltage higher than the fifth voltage to the second selection gate and the control gate of the memory cell, and applying 0V or a positive seventh voltage to the source and the first selection gate for precharging; and applying a negative eighth voltage to the control gate for releasing the electric charges from the charge storage layer after the prechargeing step. In this case, the release of the electric charges from the charge storage layer can be achieved without applying a higher voltage to the control gate.

Alternatively, the nonvolatile memory device driving method may further comprise the steps of: applying a positive fifth voltage to the source, applying a positive sixth voltage higher than the fifth voltage to the first selection gate and the control gate of the memory cell, and applying 0V or a positive seventh voltage to the drain and the second selection gate for precharging; and applying a negative eighth voltage to the control gate for releasing the electric charges from the charge storage layer after the precharging step. In this case, the release of the electric charges from the charge storage layer can be achieved without applying a higher voltage to the control gate.

Alternatively, the nonvolatile memory device driving method may further comprise the steps of: applying a positive fifth voltage to the drain and the source, and applying a positive sixth voltage higher than the fifth voltage to the first selection gate, the second selection gate and the control gate of the memory cell for precharging; and applying a negative seventh voltage to the control gate for releasing the electric charges from the charge storage layer after the precharging step. In this case, the release of the electric charges from the charge storage layer can be achieved in a shorter period of time without applying a higher voltage to the control gate.

According to another inventive aspect, there is provided a method for driving a nonvolatile memory device which comprises a semiconductor substrate, at least one island semiconductor layer provided on the semiconductor substrate, at least one memory cell having a control gate and a charge storage layer partly or entirely surrounding a peripheral surface of the island semiconductor layer, a selection transistor provided between the memory cell and the semiconductor substrate and having an insulation layer and a selection gate, a source diffusion layer provided as a source between the semiconductor substrate and the island semiconductor layer provided with the memory cell and the selection transistor for electrically isolating the island semiconductor layer from the semiconductor substrate, and a drain diffusion layer provided as a drain in an end surface of the island semiconductor layer opposite from the source diffusion layer with respect to the memory cell, the method comprising the steps of: applying a negative first voltage to the drain and the selection gate, and applying 0V or a positive second voltage to the source; and applying a positive third voltage to the control gate of the memory cell for injecting electric charges into the charge storage layer.

According to this inventive aspect, the electric charges are injected into the charge storage layer of the nonvolatile memory device for a writing operation by applying the negative first voltage to the drain while applying 0V or the positive second voltage to the source and applying the negative first voltage to the selection gate. Thus, the flow of an excessive electric current into the drain can be prevented without the need for the provision of the triple well structure which requires a complicated production process. In addition, the injection of the electric charges into the charge storage layer can be achieved without applying a higher voltage to the control gate. Therefore, the size of the decoder transistor and the booster circuit in the chip can be reduced, thereby reducing the area of the chip.

The nonvolatile memory device driving method may further comprise the steps of: applying a positive fourth voltage to the drain, applying a positive fifth voltage higher than the fourth voltage to the control gate of the memory cell, and applying 0V or a positive sixth voltage to the source and the selection gate for precharging; and applying a negative seventh voltage to the control gate for releasing the electric charges from the charge storage layer after the prechargeing step. In this case, the release of the electric charges from the charge storage layer can be achieved without applying a higher voltage to the control gate.

Alternatively, the nonvolatile memory device driving method may further comprise the steps of: applying a positive fourth voltage to the drain and the source, and applying a positive fifth voltage higher than the fourth voltage to the selection gate and the control gate of the memory cell for precharging; and applying a negative sixth voltage to the control gate for releasing the electric charges from the charge storage layer after the precharging step. In this case, the release of the electric charges from the charge storage layer can be achieved in a shorter period of time without applying a higher voltage to the control gate.

According to further another inventive aspect, there is provided a semiconductor storage device, which comprises: a nonvolatile memory device comprising a semiconductor substrate, at least one island semiconductor layer provided on the semiconductor substrate, at least one memory cell having a control gate and a charge storage layer partly or entirely surrounding a peripheral surface of the island semiconductor layer, a first selection transistor provided between the memory cell and the semiconductor substrate and having a first insulation layer and a first selection gate, a source diffusion layer provided as a source between the semiconductor substrate and the island semiconductor layer provided with the memory cell and the first selection transistor for electrically isolating the island semiconductor layer from the semiconductor substrate, a drain diffusion layer provided as a drain in an end surface of the island semiconductor layer opposite from the source diffusion layer with respect to the memory cell, and a second selection transistor provided between the memory cell and the drain diffusion layer and having a second insulation layer and a second selection gate; a first voltage generating section which generates a voltage to be applied to the control gate; a second voltage generating section which generates a voltage to be applied to the first selection gate; a third voltage generating section which generates a voltage to be applied to the drain; a fourth voltage generating section which generates a voltage to be applied to the source; a fifth voltage generating section which generates a voltage to be applied to the second selection gate; and a state controlling section which controls the voltages generated by the first to fifth voltage generating sections and timing for the application of the voltages; wherein the state controlling section controls the first to fifth voltage generating sections to cause the second voltage generating section and the third voltage generating section to generate a negative first voltage to apply the first voltage to the first selection gate and the drain, to cause the fifth voltage generating section to generate a positive second voltage to apply the second voltage to the second selection gate, to cause the fourth voltage generating section to generate 0V or a positive third voltage to apply 0V or the third voltage to the source, and to cause the first voltage generating section to generate a positive fourth voltage higher than the second voltage to apply the fourth voltage to the control gate of the memory cell for injecting electric charges into the charge storage layer. The negative first voltage is applied to the drain, while 0V or the positive third voltage is applied to the source and the negative first voltage is applied to the first selection gate. Therefore, the flow of an excessive electric current into the drain can be prevented without the need for the provision of the triple well structure which requires a complicated production process. In addition, the injection of the electric charges into the charge storage layer can be achieved without applying a higher voltage to the control gate. Therefore, the gate width and length of the transistor in the decoder or the booster circuit in the chip can be reduced, thereby reducing the area of the chip.

The respective voltage generating sections generate the positive or negative voltages from a power supply voltage applied to the semiconductor storage device by means of a known charge pump circuit. The semiconductor storage device further comprises switching means which applies the generated voltages to the respective terminals at required time points. The state controlling section controls signals to be generated within the semiconductor storage device, the respective voltages, and the timing for the application of the voltages according to control information applied from the outside of the semiconductor storage device. The state controlling section may comprise a microcontroller having a predetermined program, or may comprise a logic circuit. The state controlling section also controls the charge pump circuit and the switching means to apply the voltages at the predetermined time points.

In the inventive semiconductor storage device, the state controlling section controls the first to fifth voltage generating sections to cause the third voltage generating section to generate a positive fifth voltage to apply the fifth voltage to the drain, to cause the fifth voltage generating section and the first voltage generating section to generate a positive sixth voltage higher than the fifth voltage to apply the sixth voltage to the second selection gate and the control gate of the memory cell, to cause the fourth voltage generating section and the second voltage generating section to generate 0V or a positive seventh voltage to apply 0V or the seventh voltage to the source and the first selection gate, and then to cause the first voltage generating section to generate a negative eighth voltage to apply the eighth voltage to the control gate for releasing the electric charges from the charge storage layer. Thus, the release of the electric charges from the charge storage layer can be achieved without applying a higher voltage to the control gate.

In the inventive semiconductor storage device, alternatively, the state controlling section may control the first to fifth voltage generating sections to cause the fourth voltage generating section to generate a positive fifth voltage to apply the fifth voltage to the source, to cause the second voltage generating section and the first voltage generating section to generate a positive sixth voltage higher than the fifth voltage to apply the sixth voltage to the first selection gate and the control gate of the memory cell, to cause the third voltage generating section and the fifth voltage generating section to generate 0V or a positive seventh voltage to apply 0V or the seventh voltage to the drain and the second selection gate, and then to cause the first voltage generating section to generate a negative eighth voltage to apply the eighth voltage to the control gate for releasing the electric charges from the charge storage layer. Thus, the release of the electric charges from the charge storage layer can be achieved without applying a higher voltage to the control gate.

In the inventive semiconductor storage device, alternatively, the state controlling section may control the first to fifth voltage generating sections to cause the third voltage generating section and the fourth voltage generating section to generate a positive fifth voltage to apply the fifth voltage to the drain and the source, to cause the second voltage generating section, the fifth voltage generating section and the first voltage generating section to generate a positive sixth voltage higher than the fifth voltage to apply the sixth voltage to the first selection gate, the second selection gate and the control gate of the memory cell, and then to cause the first voltage generating section to generate a negative seventh voltage to apply the seventh voltage to the control gate for releasing the electric charges from the charge storage layer. Thus, the release of the electric charges from the charge storage layer can be achieved in a shorter period of time without applying a higher voltage to the control gate.

According to still another inventive aspect, there is provided a liquid crystal display device which comprises the semiconductor storage device described above.

DESCRIPTION OF THE PREFERRED EMBODIMENTS

With reference to the attached drawings, the present invention will hereinafter be described in detail by way of embodiments thereof. It should be understood that the invention be not limited to these embodiments.

First Embodiment

Figure 8:
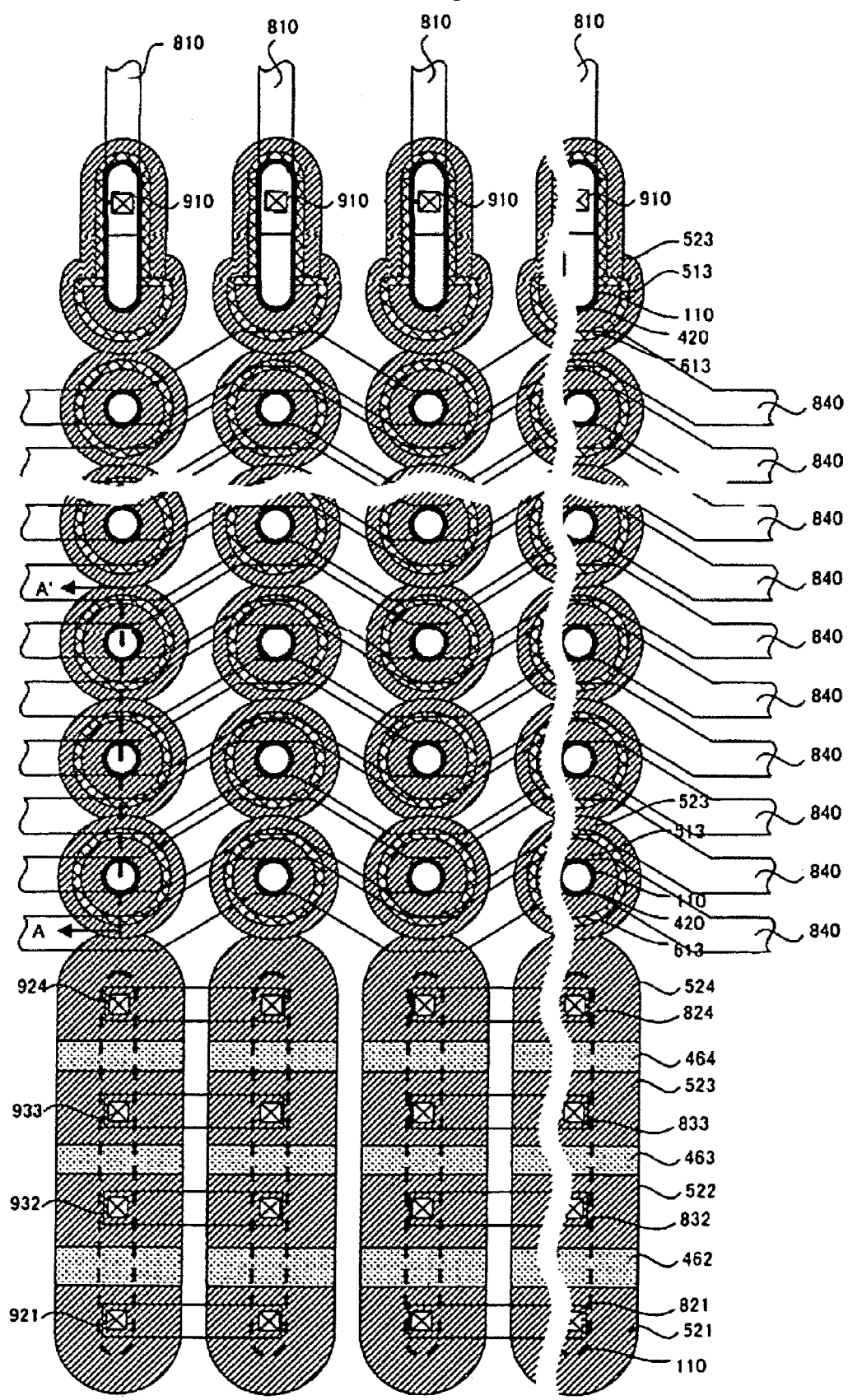
FIG. 8 is a plan view of memory cell arrays each including a plurality of such nonvolatile memory devices according to the present invention.

With reference to FIGS. 9 to 28, an explanation will be given to an exemplary production process for producing a nonvolatile memory device of a semiconductor storage device according to the present invention. The nonvolatile memory device to be produced in this embodiment includes an island semiconductor layer formed, for example, by processing a semiconductor substrate into a sea-island configuration and having a peripheral surface serving as an active region, selection transistors provided in association with upper and lower portions of the island semiconductor layer, and a plurality of memory cells (e.g., two memory cells) each including a floating gate including a tunnel oxide film and a charge storage layer provided on the active region of the island semiconductor layer and arranged in series along the island semiconductor layer between the selection transistors. In the nonvolatile memory device, the island semiconductor layer is electrically floated from the semiconductor substrate, and active regions of the memory cells are electrically floated from each other. FIG. 8 is a plan view of memory cell arrays each including a plurality of such nonvolatile memory devices according to the present invention. FIGS. 9 to 28 are sectional views taken along a line A–A' in FIG. 8 for explaining the production process for the memory cell arrays shown in FIG. 8.

Figure 9:
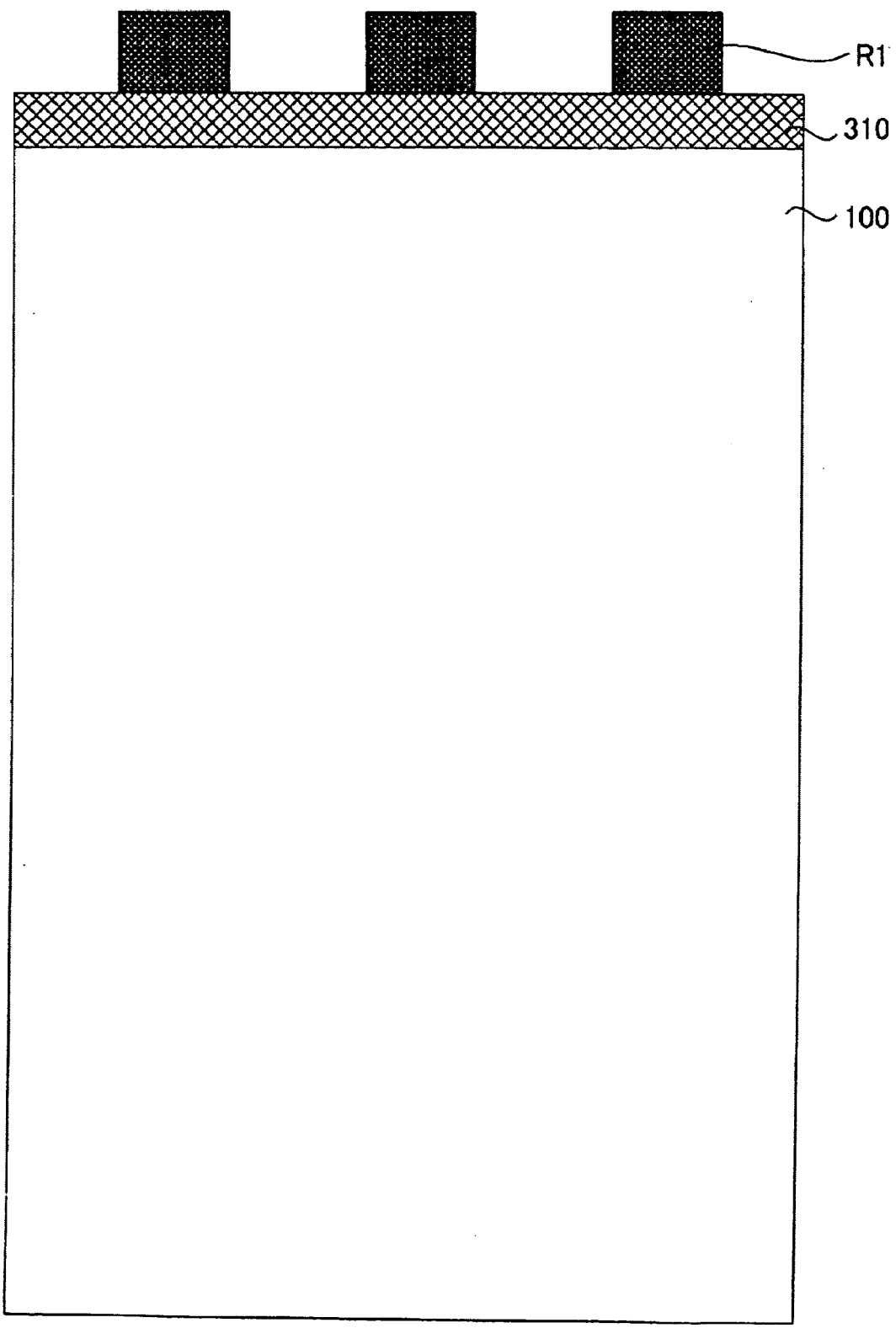
FIGS. 9 to 28 are sectional views taken along a line A–A' in FIG. 8 for explaining the production process for the memory cell arrays shown in FIG. 8.

A silicon nitride film (first insulation film) 310 having a thickness of 200 to 2,000 nm is first formed on a surface of a p-type silicon substrate (semiconductor substrate) 100. Then, a resist film is formed on the silicon nitride film 310 and patterned by a known photolithography technique for formation of a resist mask R1 (FIG. 9).

Figure 10:
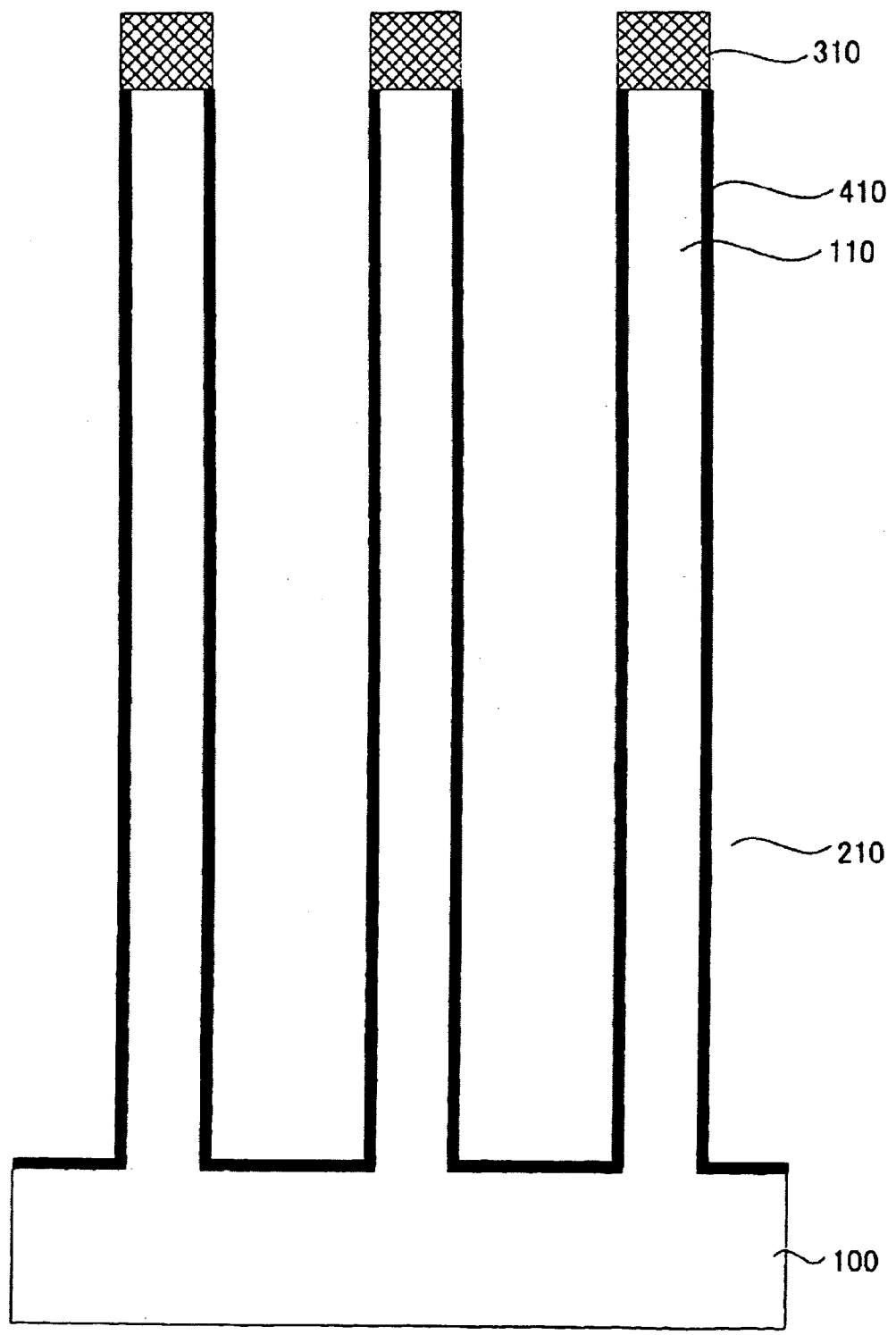

With the use of the resist mask R1, the silicon nitride film (first insulation film) 310 is etched by reactive ion etching. Then, the p-type silicon substrate (semiconductor substrate) 100 is etched to a depth of 2,000 to 20,000 nm by reactive ion etching by employing the resulting silicon nitride films (first insulation films) 310 as a mask, whereby a first lattice trench 210 is formed. Thus, a portion of the p-type silicon substrate 100 is divided into a plurality of island semiconductor layers 110 arranged in a sea-island configuration. Thereafter, an upper surface of the p-type silicon substrate 100 and peripheral surfaces of the respective island semiconductor layers 110 are thermally oxidized, whereby a thermal oxide film (second insulation film) 410 is formed (FIG. 10).

Figure 11:
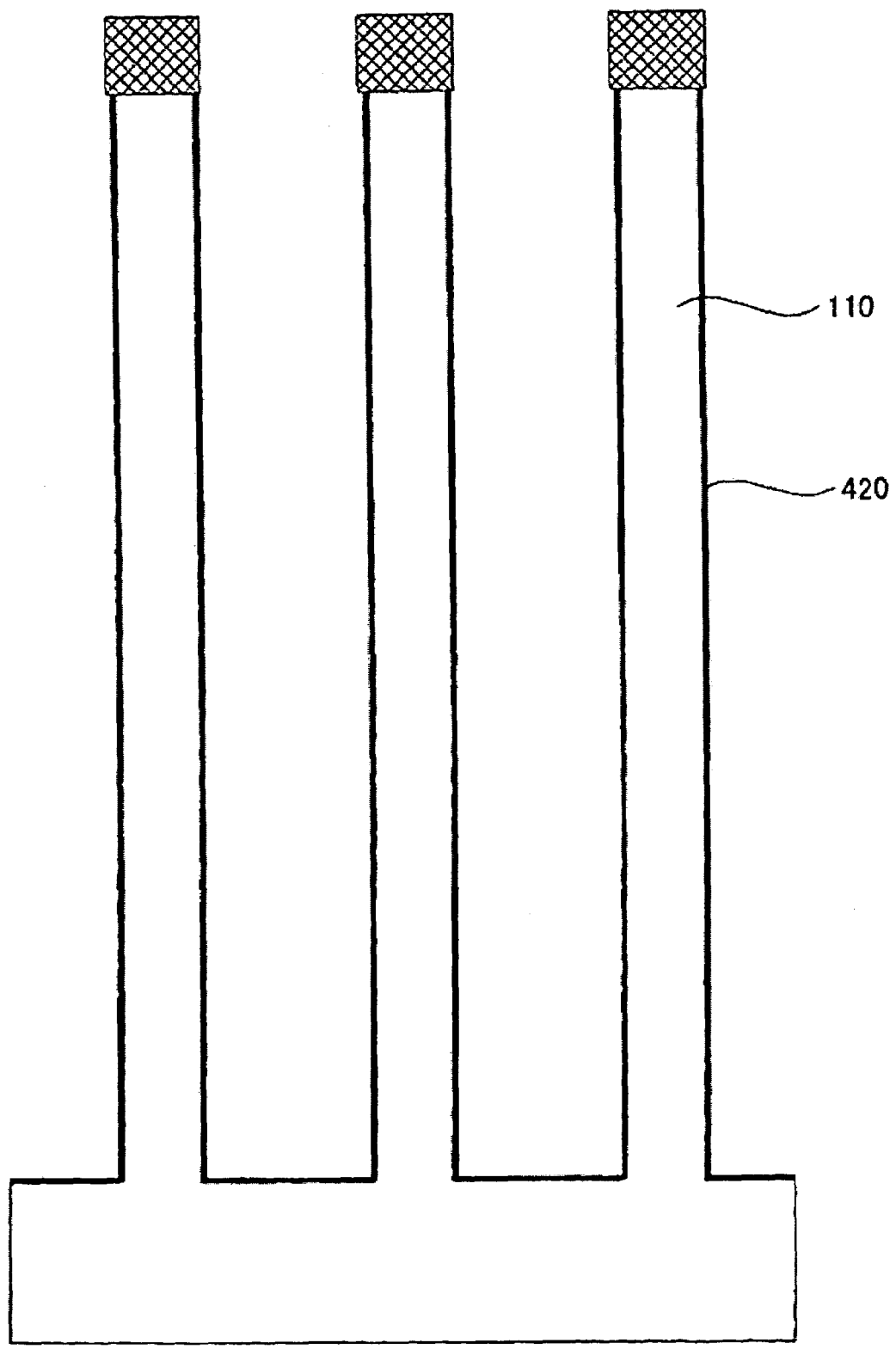

After portions of the thermal oxide film (second insulation film) 410 present in the peripheral surfaces of the island semiconductor layers 110 are selectively etched away, for example, by isotropic etching, channel ions are introduced into the peripheral surfaces of the respective island semiconductor layers 110 as required by oblique ion implantation. Alternatively, the introduction of the channel ions may be achieved by forming a boron-containing oxide film on the peripheral surfaces of the island semiconductor layers by CVD and diffusing boron into the peripheral surfaces from the oxide film rather than by the channel ion implantation. In turn, silicon oxide films (third insulation films) 420 each having a thickness of about 10 m are formed as tunnel oxide films in the peripheral surfaces of the respective island semiconductor layers 110, for example, by thermal oxidization (FIG. 11). The tunnel oxide films are not limited to the thermal oxide films, but may be CVD oxide films or nitrogen oxide films. It is merely necessary to form the third insulation films at least on the active regions of the island semiconductor layers 110, but the third insulation films may be formed as entirely covering the peripheral surfaces and upper surfaces of the island semiconductor layers 110 and the surface of the semiconductor substrate 100.

Figure 12:
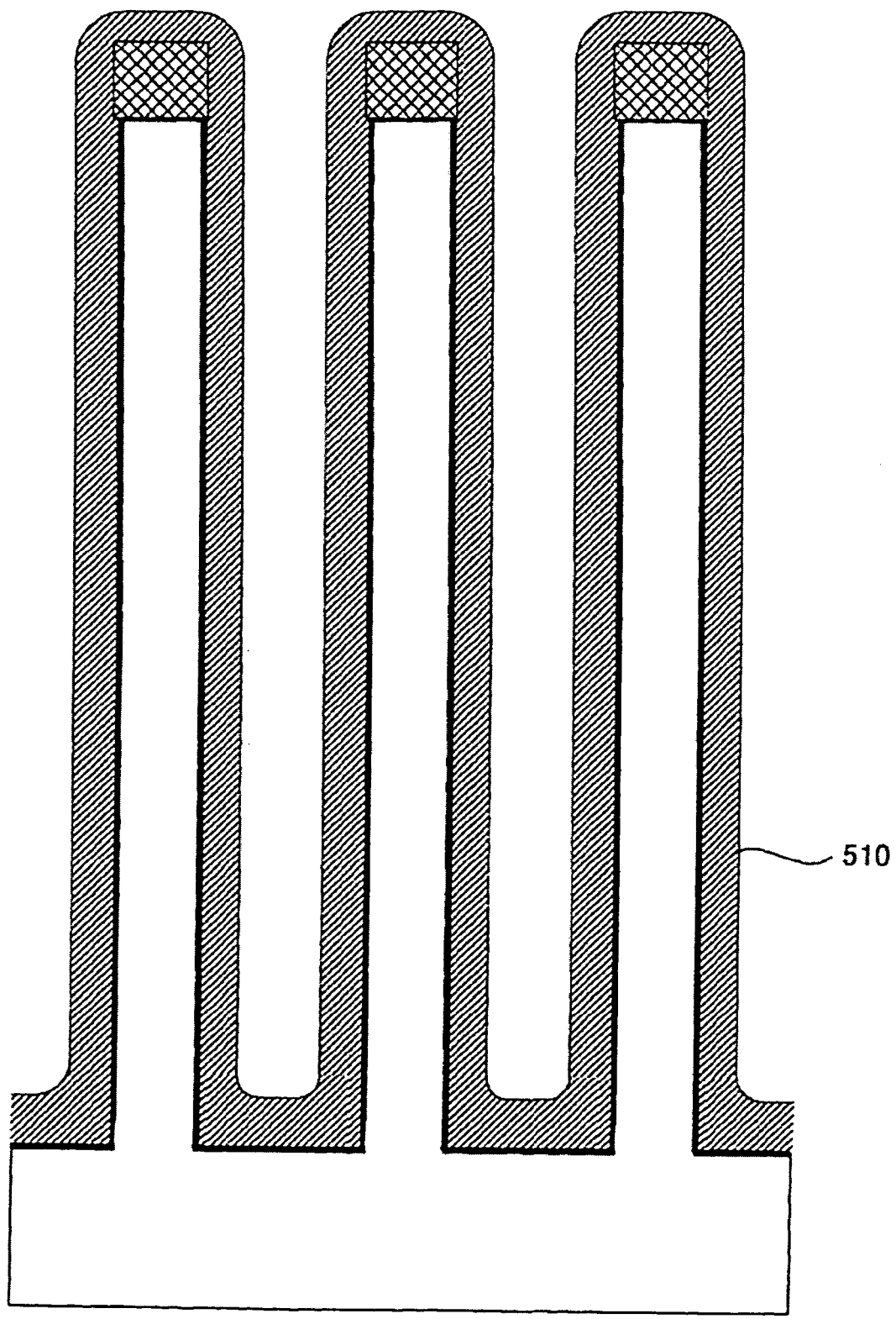
Figure 13:
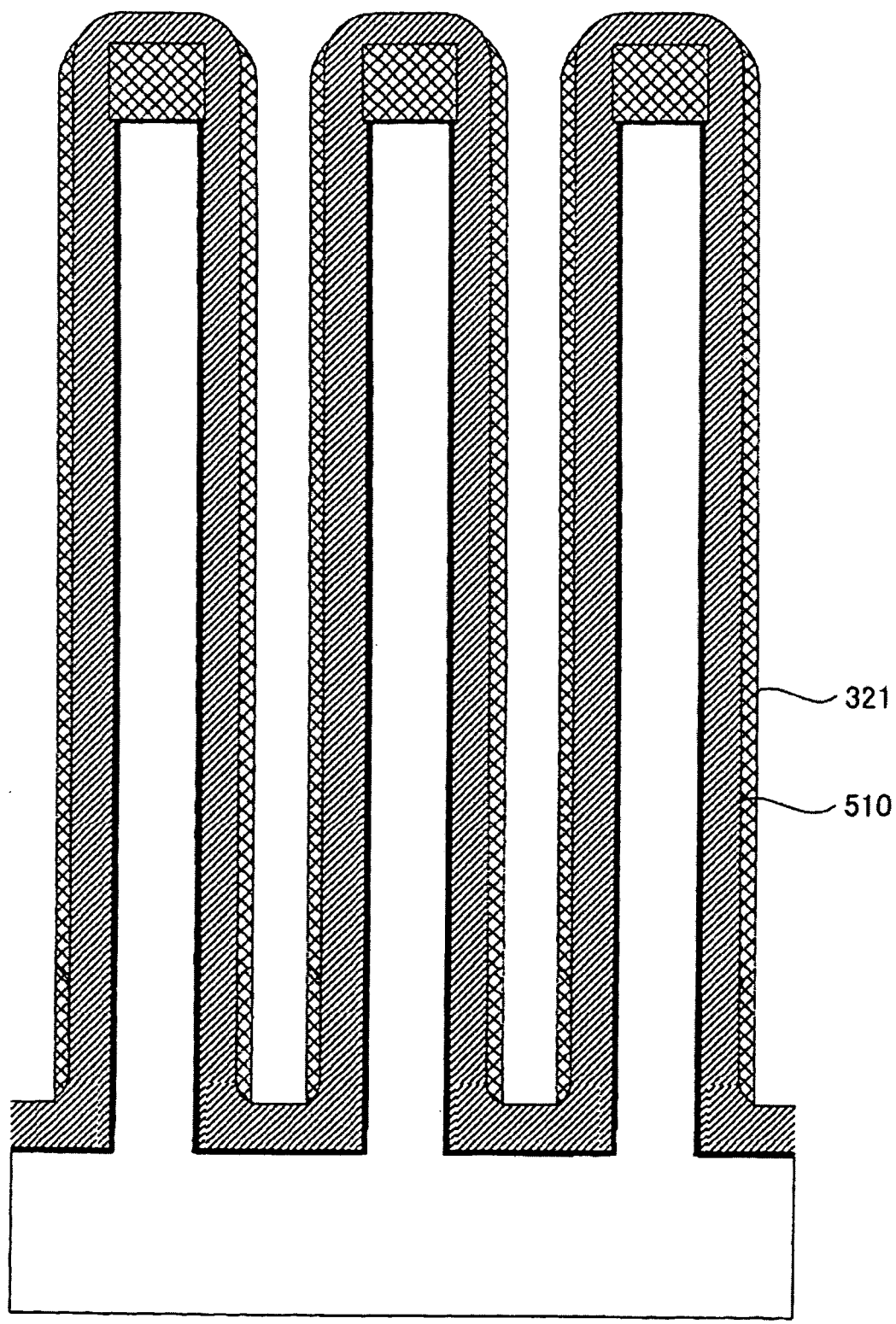

Subsequently, a polycrystalline silicon film (first electrically conductive film) 510 is formed as entirely covering the peripheral surfaces and upper surfaces of the island semiconductor layers 110 and the surface of the semiconductor substrate 100 (FIG. 12). However, it is merely necessary to form the first electrically conductive film at least on the peripheral surfaces of the island semiconductor layers 110. Thereafter, a silicon nitride film (fourth insulation film) 321 is formed by CVD, and then selectively etched away, for example, by reactive ion etching, so that portions of the silicon nitride film (fourth insulation film) 321 are left as side wall spacers on the peripheral surface portions of the polycrystalline silicon film (first electrically conductive film) 510 (FIG. 13).

Figure 14:
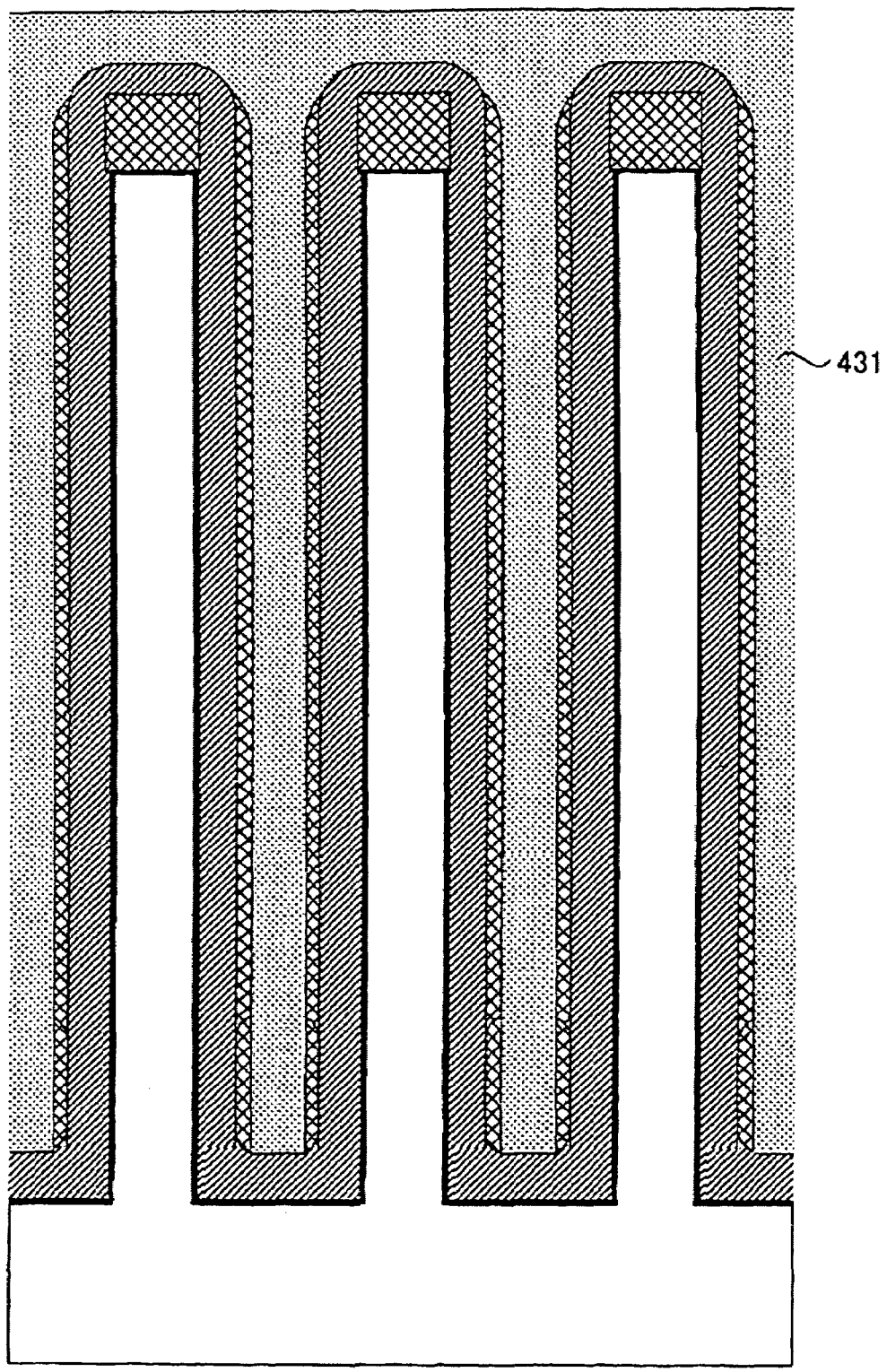
Figure 15:
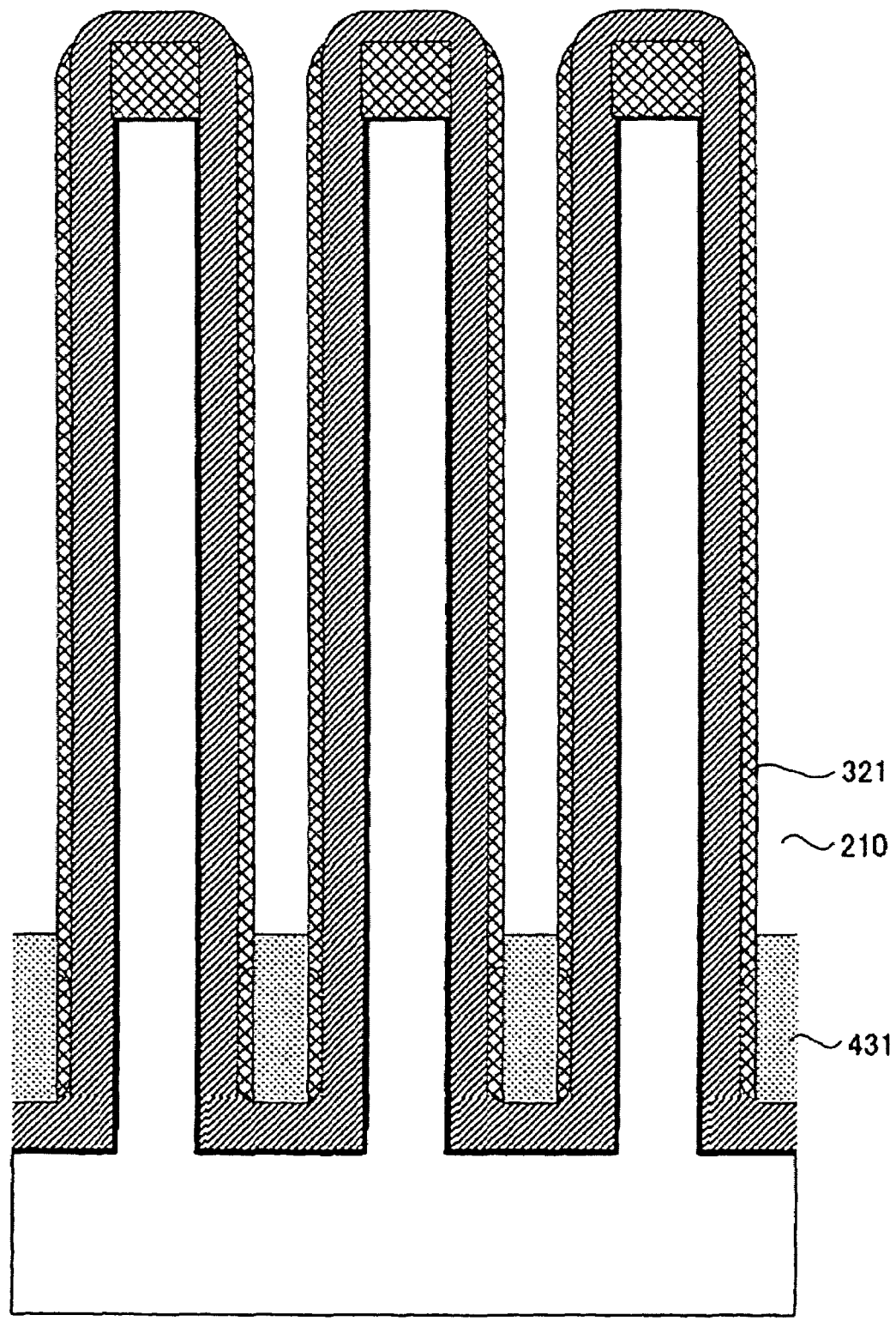
Figure 16:
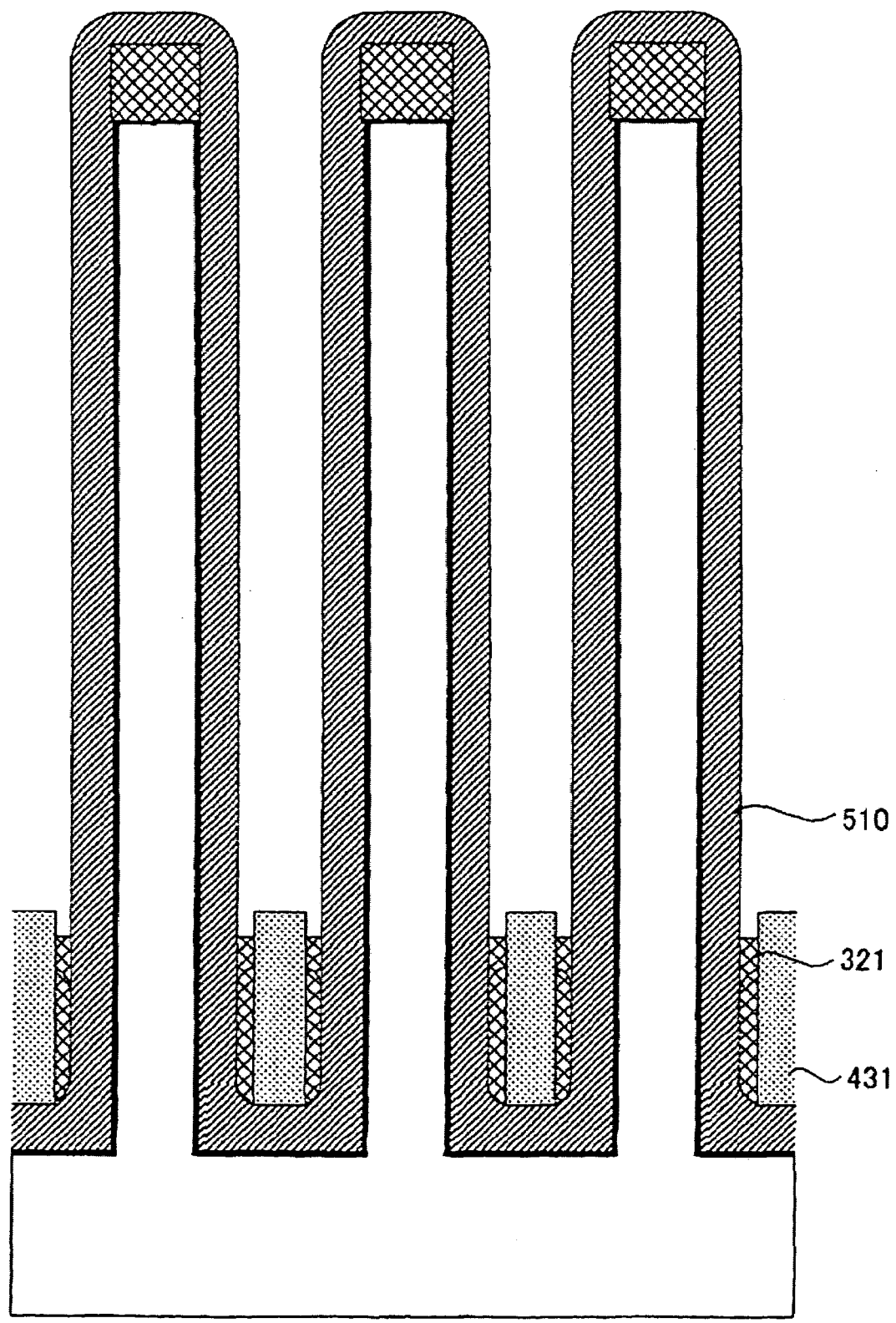

A silicon oxide film (fifth insulation film) 431 is formed in the first lattice trench 210 by CVD (FIG. 14). The silicon oxide film (fifth insulation film) 431 is partly removed so as to fill the first lattice trench 210 to a desired depth (FIG. 15). The silicon nitride films (fourth insulation films) 321 are partly etched away by isotropic etching by employing the silicon oxide film (fifth insulation film) 431 as a mask, so that portions of the silicon nitride films (fourth insulation films) 321 present between the silicon oxide film (fifth insulation film) 431 and the polycrystalline silicon film (first electrically conductive film) 510 are left (FIG. 16). At this time, the silicon nitride films (fourth insulation films) 321 are recessed from an upper surface of the silicon oxide film (fifth insulation film) 431. Then, silicon oxide films (sixth insulation films) 441 are formed in the recesses. At this time, the silicon oxide films (sixth insulation films) 441 each have a thickness not smaller than about one half the thickness of the silicon nitride films (fourth insulation films) 321 to fill the recesses. Further, portions of the oxide films 441 present on the polycrystalline silicon films (first electrically conductive films) 510 outside the recesses are removed, for example, by isotropic etching. The silicon oxide films (sixth insulation films) 441 are present in the recesses, so that the silicon nitride films (fourth insulation films) 321 are confined by the silicon oxide films (fifth insulation films) 431 and the silicon oxide films (sixth insulation films) 441.

Figure 17:
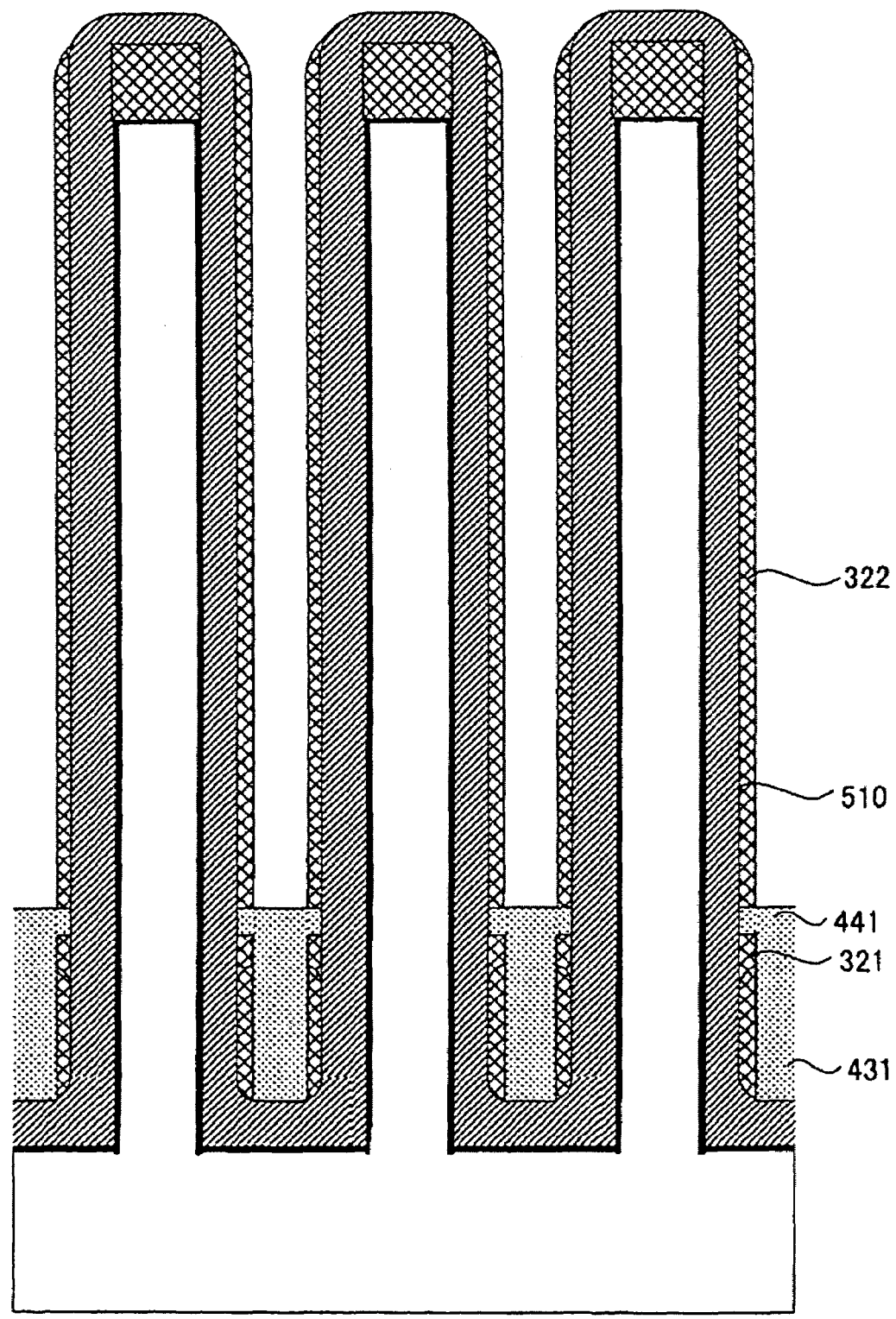
Figure 18:
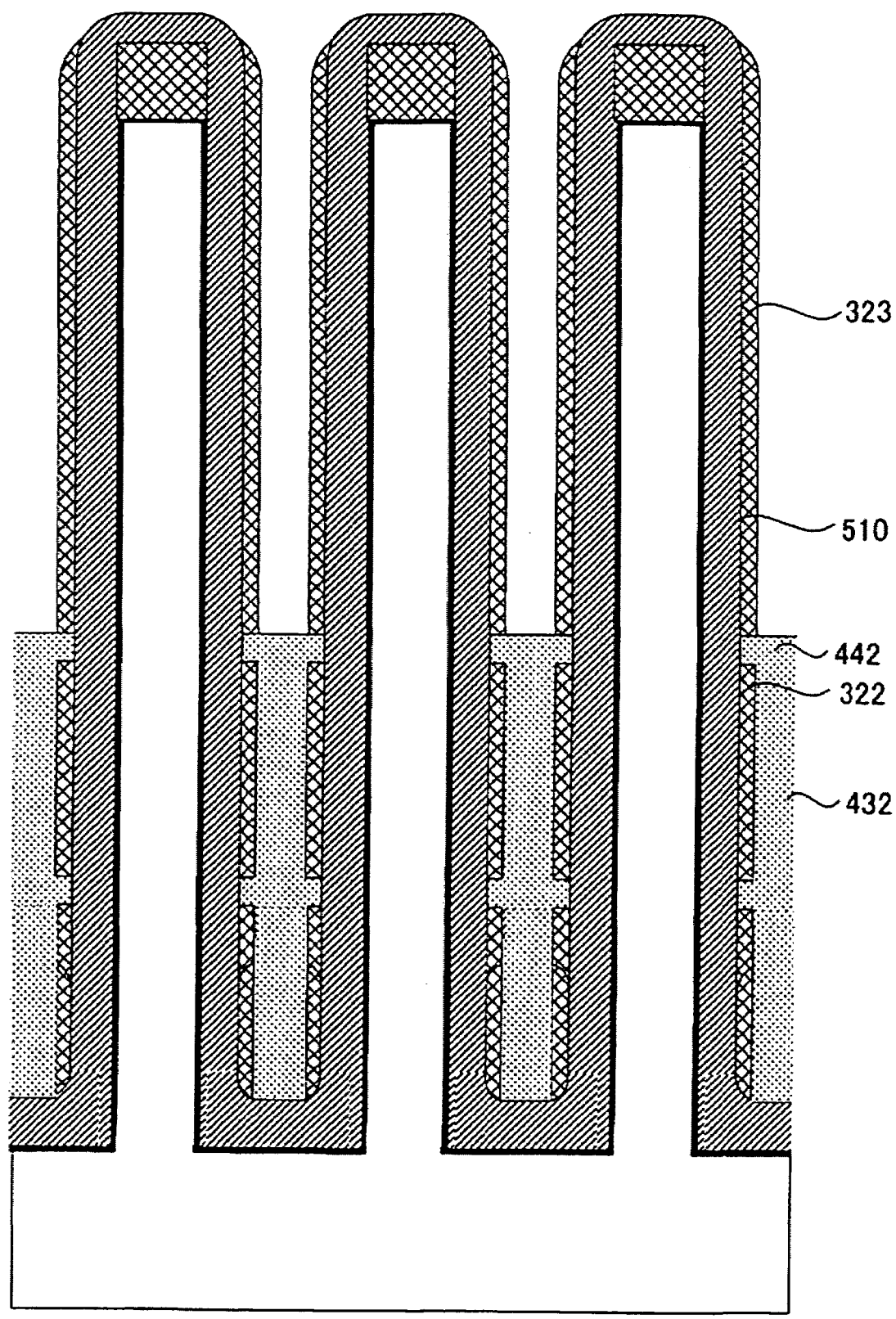

In turn, a silicon nitride film (fourth insulation film) 322 is formed in the same manner as described above by CVD, and selectively etched away by reactive ion etching, so that portions of the silicon nitride film (fourth insulation film) 322 are left as side wall spacers on the peripheral surface portions of the polycrystalline silicon film (first electrically conductive film) 510 (FIG. 17). After a silicon oxide film (fifth insulation film) 432 is formed in the first lattice trench 210 in substantially the same manner as described above, silicon oxide films (sixth insulation films) 442 are formed in recesses on the silicon nitride films (fourth insulation films) 322 provided as the side wall spacers in the same manner as described above. Then, silicon nitride films (fourth insulation films) 323 are formed as side wall spacers on the peripheral surface portions of the polycrystalline silicon film (first electrically conductive film) 510 in the same manner as described above (FIG. 18).

Figure 19:
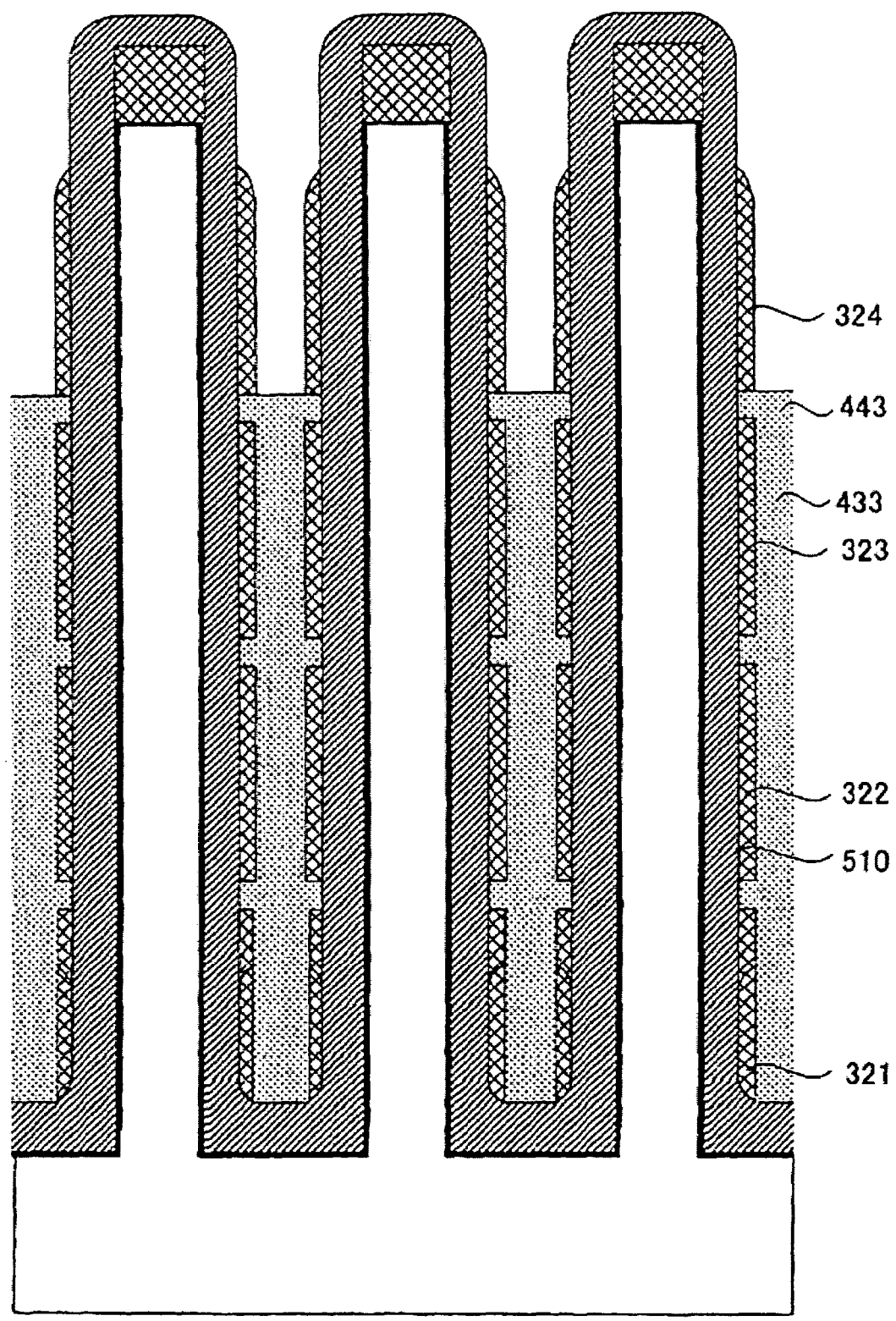
Figure 20:
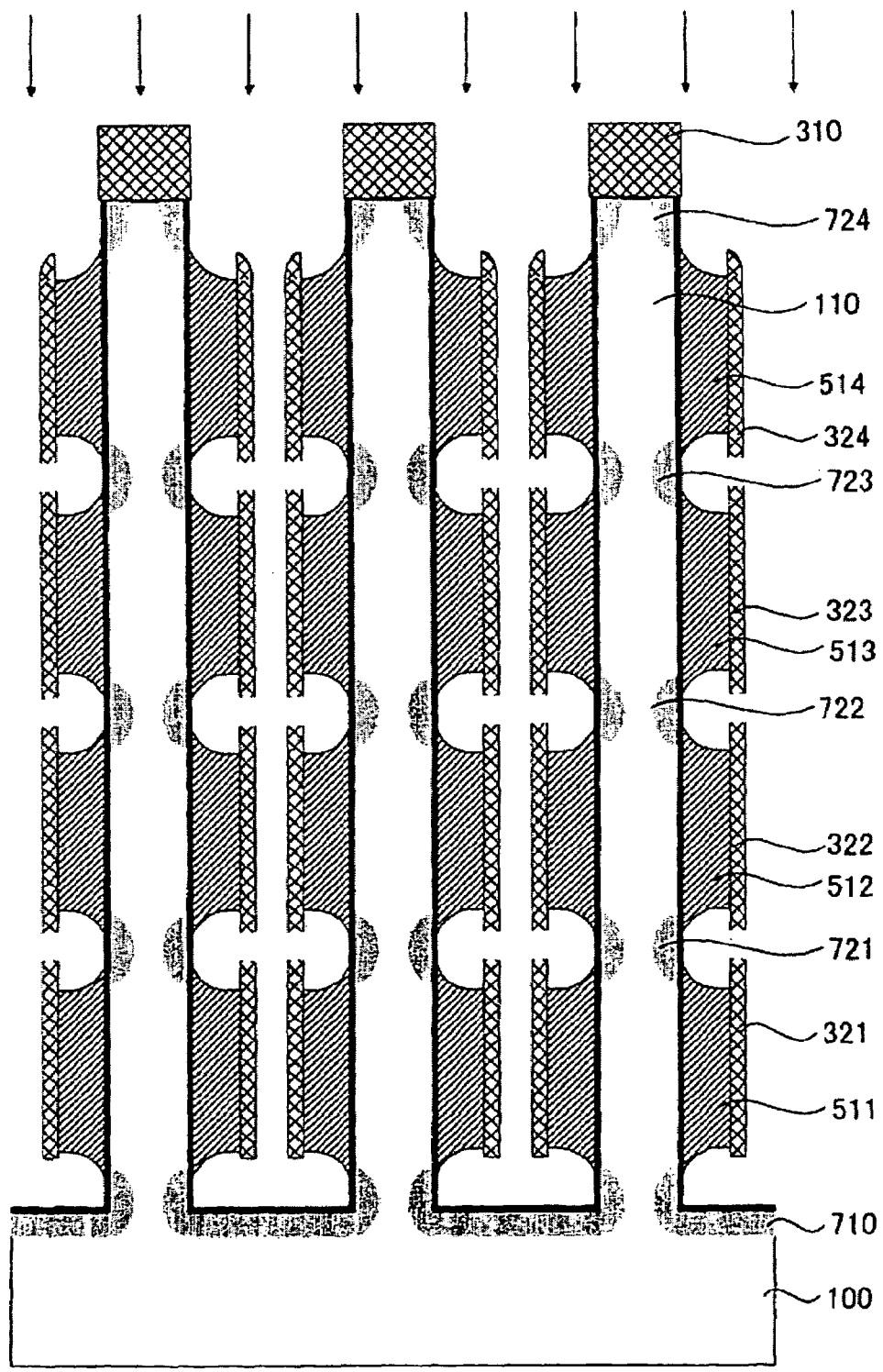

By repeating these steps, the plural silicon nitride films (fourth insulation films) 321 to 324 are formed as the side wall spacers on each of the peripheral surface portions of the polycrystalline silicon film (first electrically conductive film) 510 (FIG. 19). Then, the peripheral surface portions of the polycrystalline silicon film (first electrically conductive film) 510 are each divided into a plurality of polycrystalline silicon films (first electrically conductive films) 511 to 514 by isotropic etching (FIG. 20). Alternatively, the division of the polycrystalline silicon film (first electrically conductive film) 510 may be achieved by thermal oxidation by employing the silicon nitride films (fourth insulation films) 321 to 324 as a mask. Further, the etching and the thermal oxidation may be employed in combination for the division of the polycrystalline silicon film 510. An impurity is introduced into portions of the island semiconductor layers 110 and portions of the semiconductor substrate 100 in self-alignment with the polycrystalline silicon films (first electrically conductive films) 511 to 514 and the silicon nitride films (first insulation films) 310 for formation of N-type semiconductor layers 721 to 724 and impurity diffusion layers 710. At this time, the impurity concentration of the impurity diffusion layers 710 which thereafter serve as a first interconnection layer (source) may be adjusted by an ion implantation method (FIG. 20).

Figure 21:
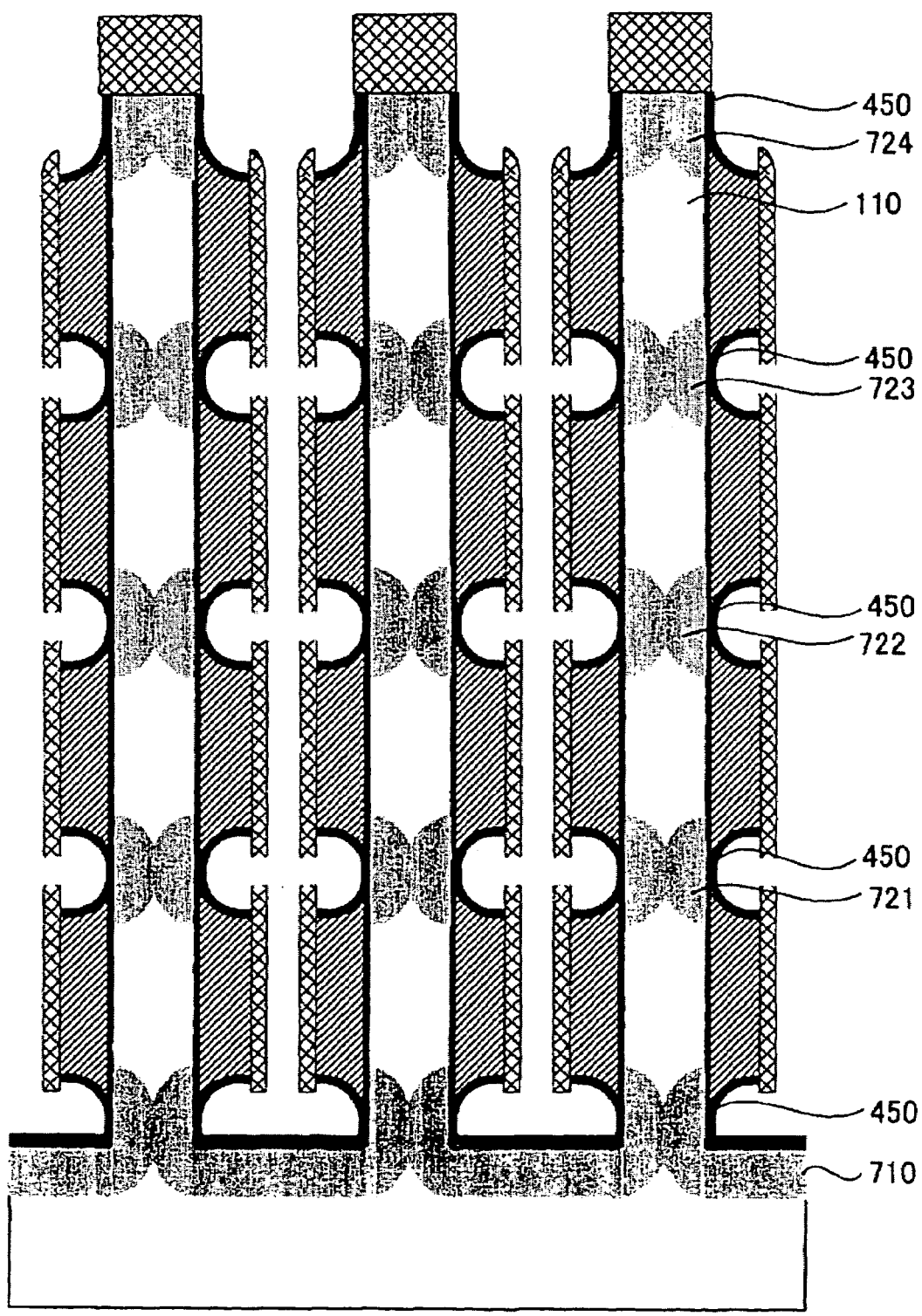

The formation of the impurity diffusion layers 710 for the first interconnection layer is not necessarily required to be carried out simultaneously with the formation of the N-type semiconductor layers 721 to 724. For example, the formation of the impurity diffusion layers 710 for the first interconnection layer may be achieved by ion implantation after the formation of the thermal oxide layer (second insulation film) 410 or after the formation of the silicon oxide films (third insulation films) 420. Further, the ion introduction may be repeated a plurality of times at the aforesaid time points. Thereafter, silicon oxide films (seventh insulation films) 450 are formed in exposed surfaces of the polycrystalline silicon films (first electrically conductive films) 511 to 514, for example, by thermal oxidation. At this time, the thermal treatment diffuses the impurity diffusion layers 710 and 721 to 724 into the island semiconductor layers 110, whereby the resulting p-type regions in the island semiconductor layers 110 are electrically floated (FIG. 21). The introduction of the impurity in the polycrystalline silicon films (first electrically conductive layers) 511 to 514 may be carried out when the polycrystalline silicon film (first electrically conductive layer) 510 is formed, or when the impurity is introduced into the island semiconductor layers 110. The timing of the impurity introduction is not particularly limited, as long as it is possible to impart the polycrystalline silicon films 511 to 514 with electrical conductivity.

Figure 22:
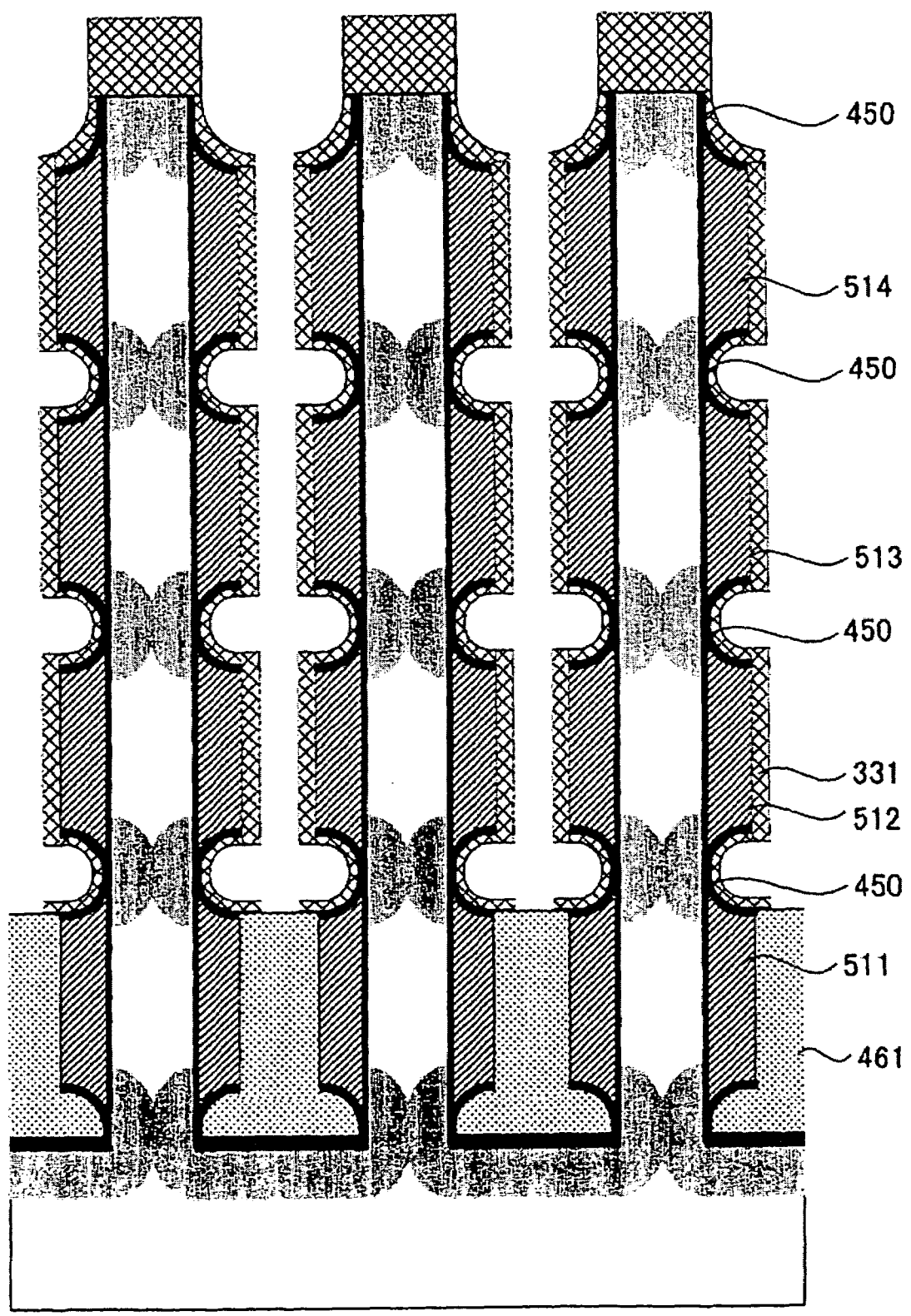

After the silicon nitride side wall spacers (fourth insulation films) 321 to 324 are removed, for example, by isotropic etching, a silicon oxide film (eighth insulation film) 461 is formed by CVD and partly etched by anisotropic etching and isotropic etching, whereby the peripheral surfaces of the polycrystalline silicon films (first electrically conductive films) 511 are covered with the resulting silicon oxide film (eighth insulation film) 461. In turn, silicon nitride films (ninth insulation films) 331 are formed as side wall spacers on the polycrystalline silicon films (first electrically conductive films) 512 to 514 and the silicon oxide films (seventh insulation films) 450 (FIG. 22).

Figure 23:
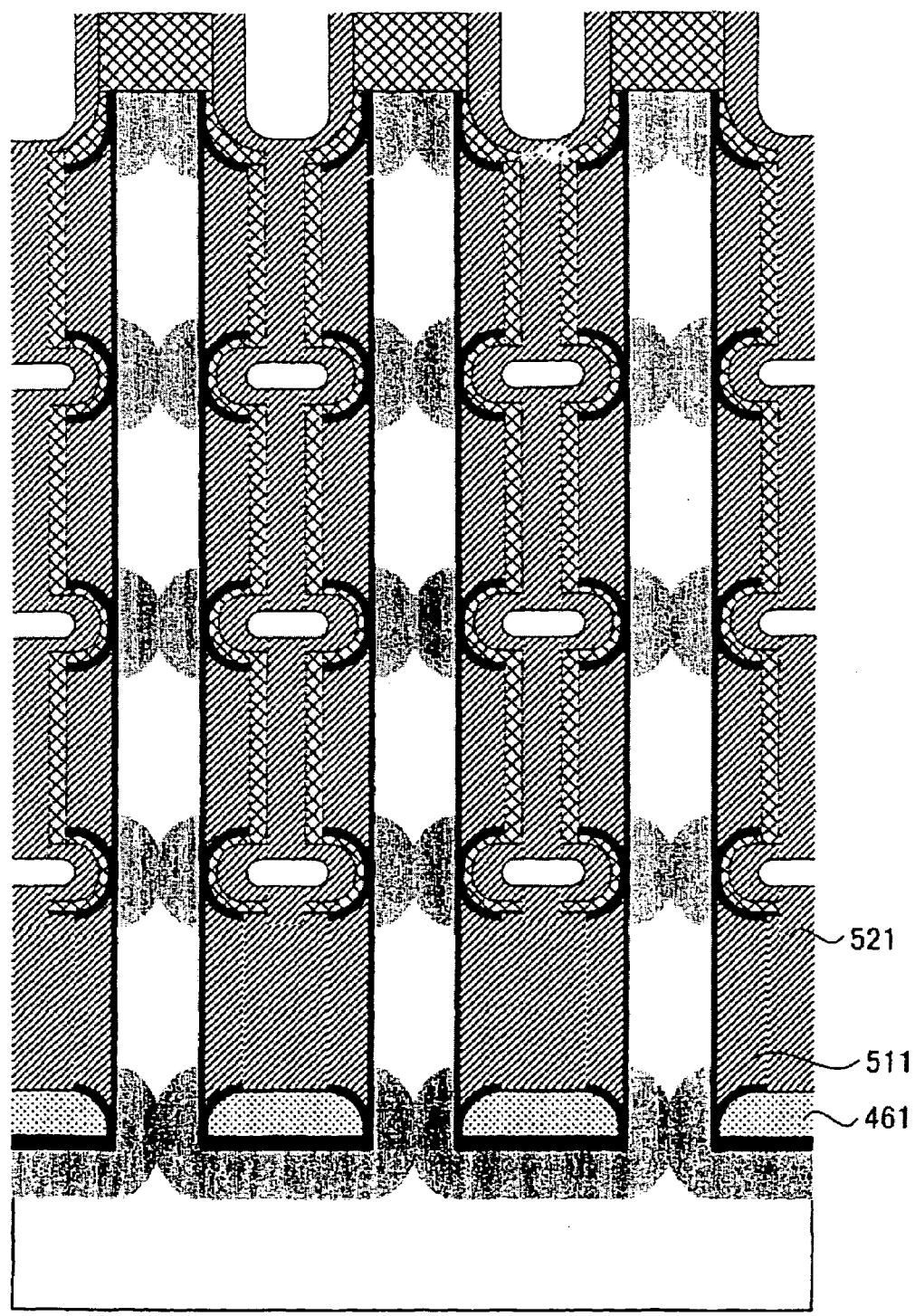
Figure 24:
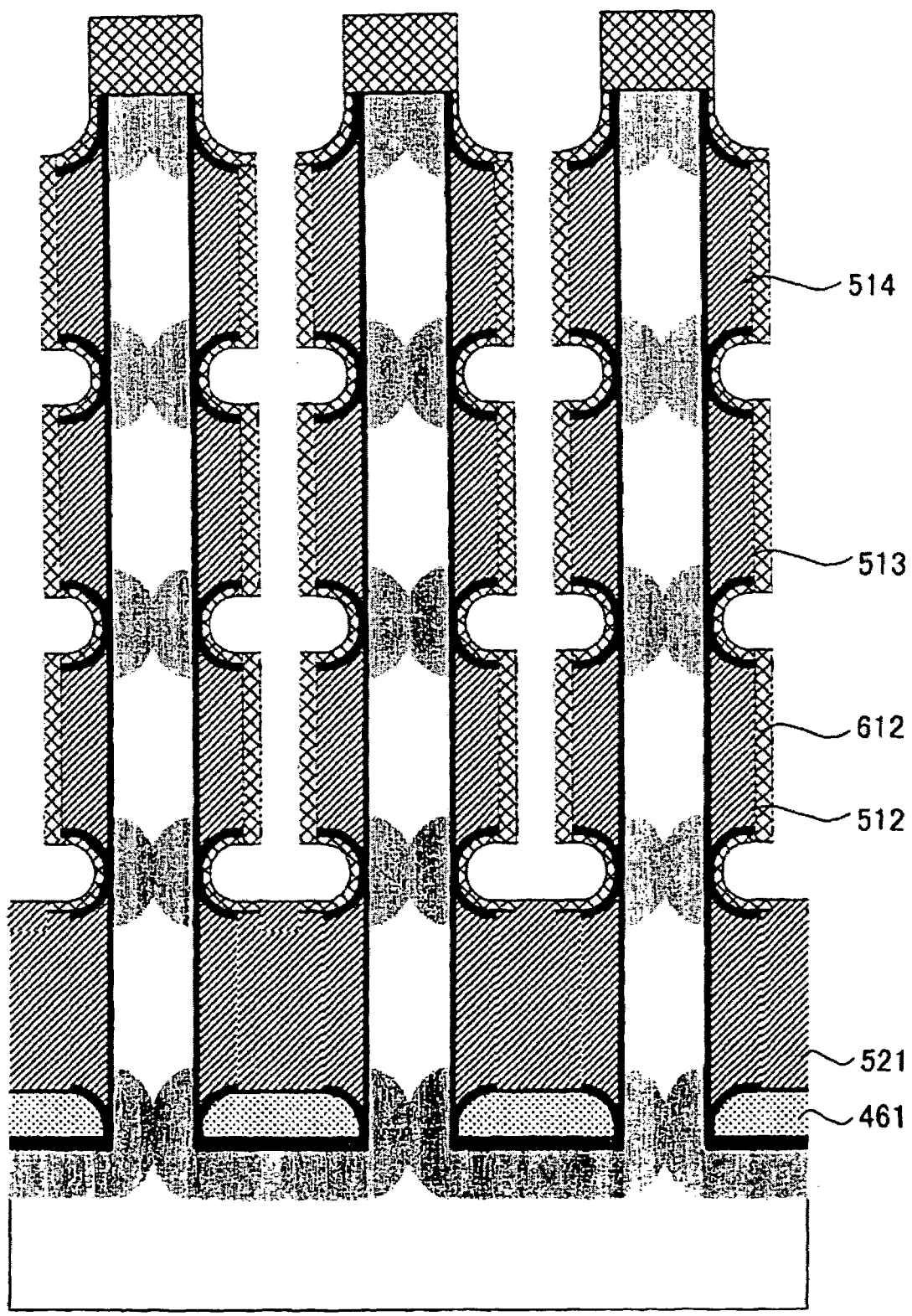

Subsequently, the silicon oxide film (eighth insulation film) 461 is etched back so as to expose the peripheral surfaces of the polycrystalline silicon films (first electrically conductive films) 511, and then polycrystalline silicon films (second electrically conductive films) 521 are formed on the peripheral surfaces of the polycrystalline silicon films (first electrically conductive films) 511 (FIG. 23). Thereafter, second trenches 220 are formed in the p-type silicon substrate (semiconductor substrate) 100 in self-alignment with the polycrystalline silicon films (second electrically conductive films) 521. That is, isolation portions for the first interconnection layer are formed in self-alignment with separated portions of the second electrically conductive films. In turn, the polycrystalline silicon films (second electrically conductive films) 521 are etched back to such an extent as to respectively contact the polycrystalline silicon films (first electrically conductive films) 511. The resulting polycrystalline silicon films (second electrically conductive films) 521 each serve as a selection gate. At this time, a selection gate line (second interconnection layer) is formed as continuously extending along the line A–A' in FIG. 8 without the need for a masking step, where a distance between the island semiconductor layers 110 as measured along the line A–A' is set at not greater than a predetermined distance. Thereafter, a silicon oxide film (eighth insulation film) 462 is formed and partly etched by anisotropic etching and isotropic etching, whereby side surfaces and upper surfaces of the polycrystalline silicon films (second electrically conductive films) 521 are covered with the resulting silicon oxide films (eighth insulation films) 462. Then, the silicon nitride side wall spacers (ninth insulation films) 331 are removed by isotropic etching, and inter-layer insulation films 612 are formed on exposed peripheral surfaces of the polycrystalline silicon films (first electrically conductive films) 512 to 514 (FIG. 24). The inter-layer insulation films 612 may be, for example, ONO films.

Figure 25:
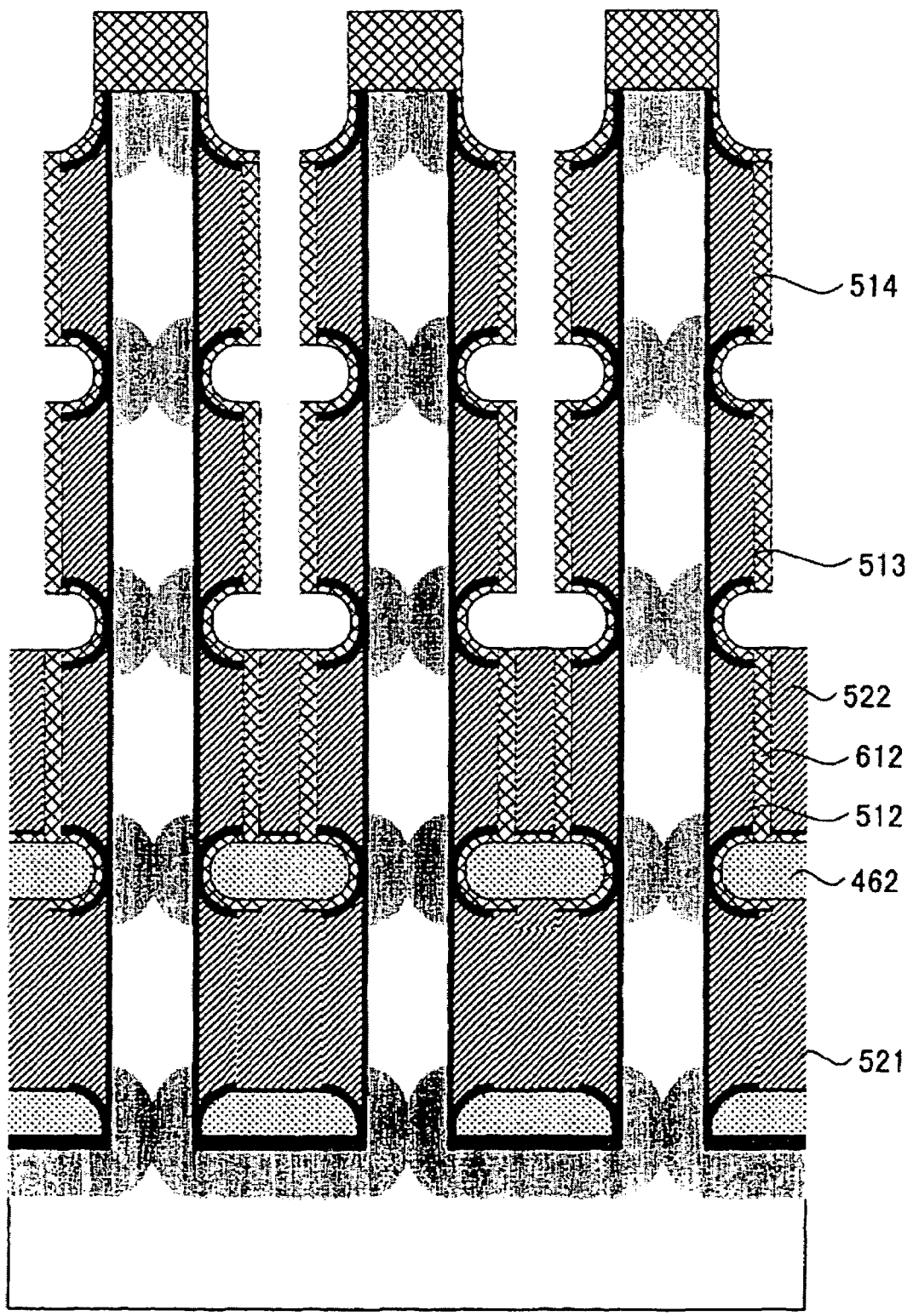
Figure 26:
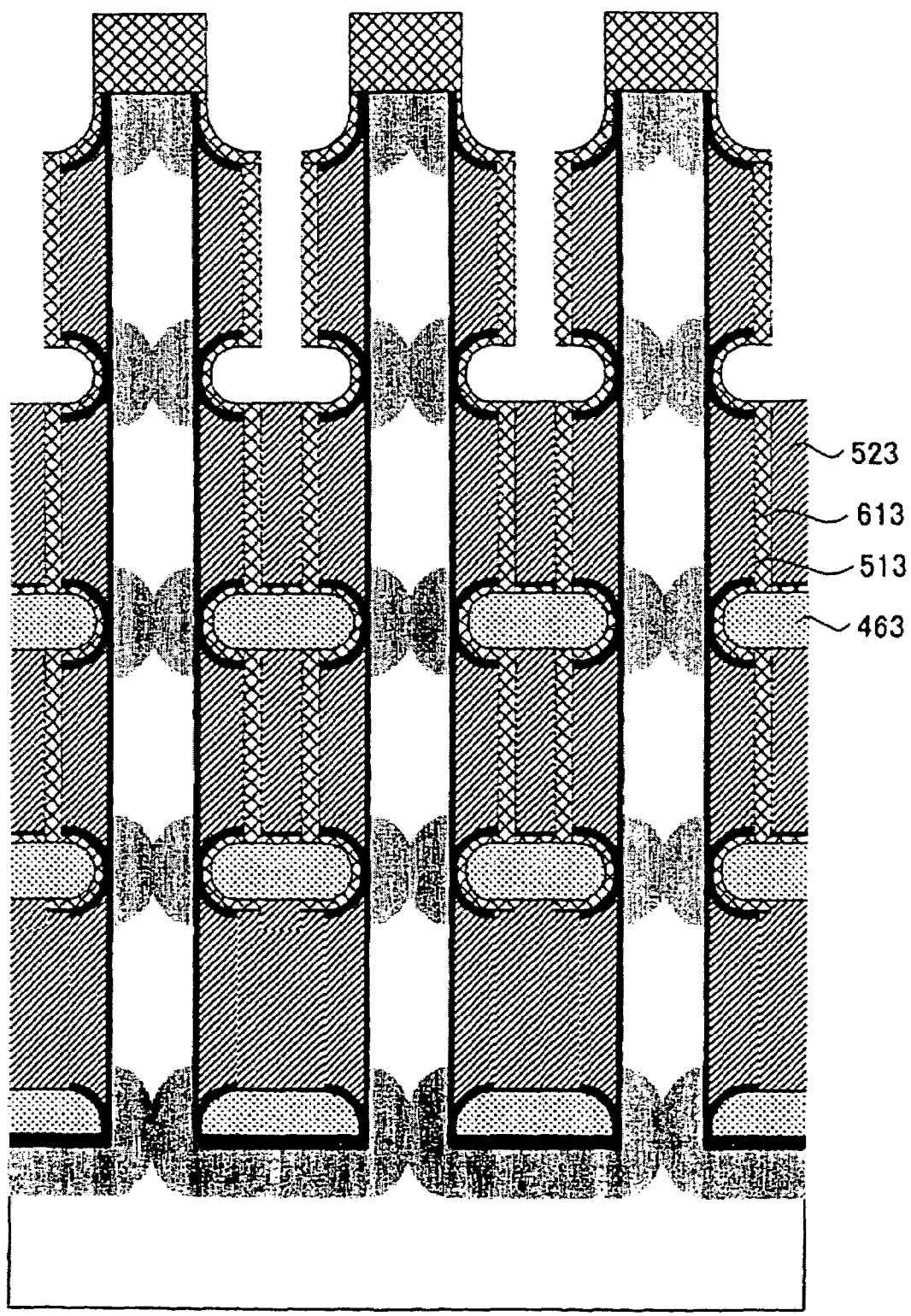

In turn, a polycrystalline silicon film (second electrically conductive film) 522 is formed and etched back in the same manner as described above, whereby the peripheral surfaces of the polycrystalline silicon films (first electrically conductive films) 512 are covered with the resulting polycrystalline silicon films (second electrically conductive films) 522 with the intervention of the inter-layer insulation films 612 (FIG. 25). At this time, a control gate line (third interconnection layer) is formed as continuously extending along the line A–A' in FIG. 8 without the need for a masking step, where the distance between the island semiconductor layers 110 as measured along the line A–A' is set at not greater than the predetermined distance. Thereafter, a silicon oxide film (eighth insulation film) 463 is formed and partly etched by anisotropic etching and isotropic etching, whereby side surfaces and upper surfaces of the polycrystalline silicon films (second electrically conductive films) 522 are covered with the resulting silicon oxide films (eighth insulation films) 463. By repeating these steps, polycrystalline silicon films (second electrically conductive films) 523 are formed on the peripheral surfaces of the polycrystalline silicon films (first electrically conductive films) 513 with the intervention of inter-layer insulation films 613 (FIG. 26).

Figure 27:
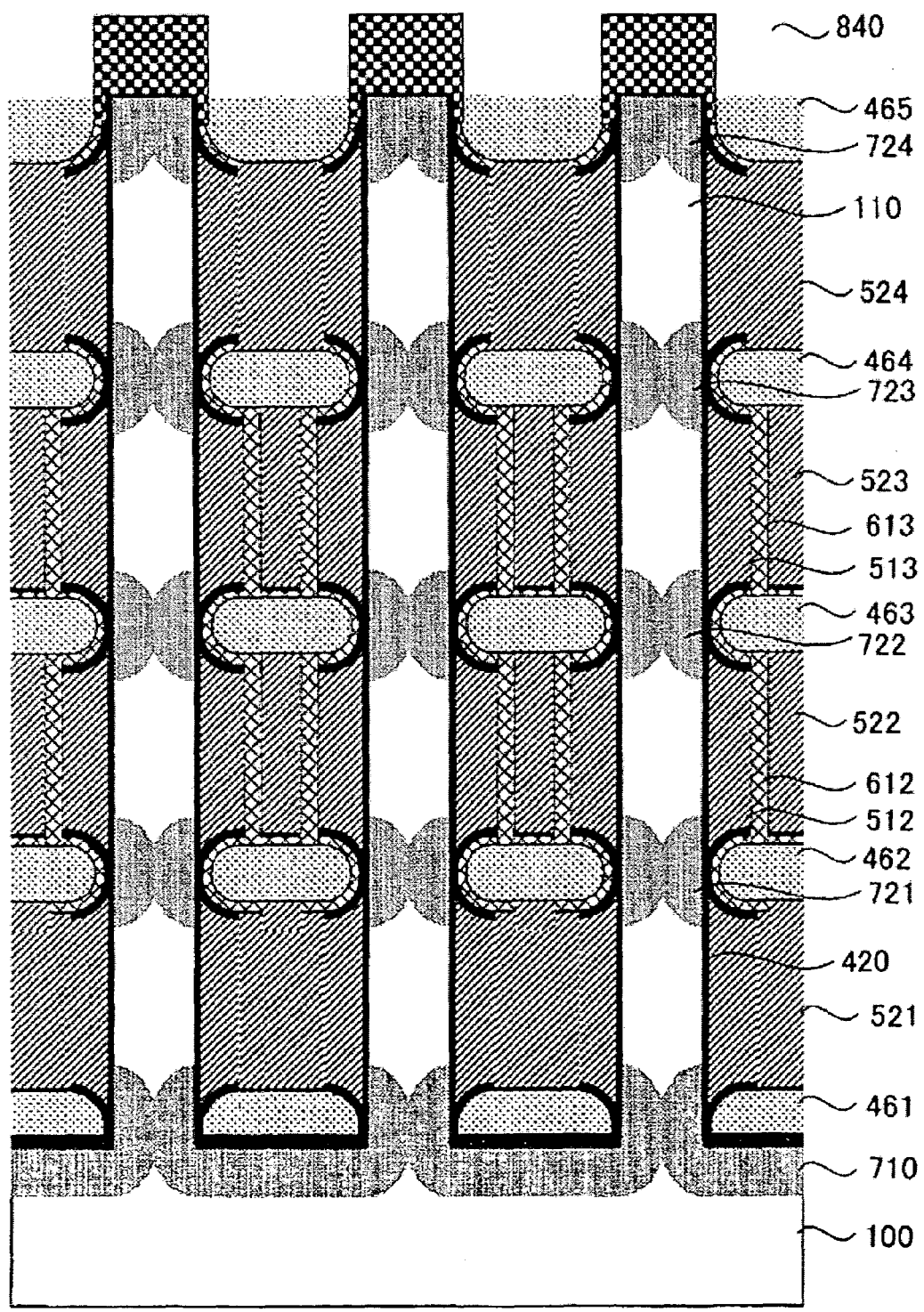
Figure 28:
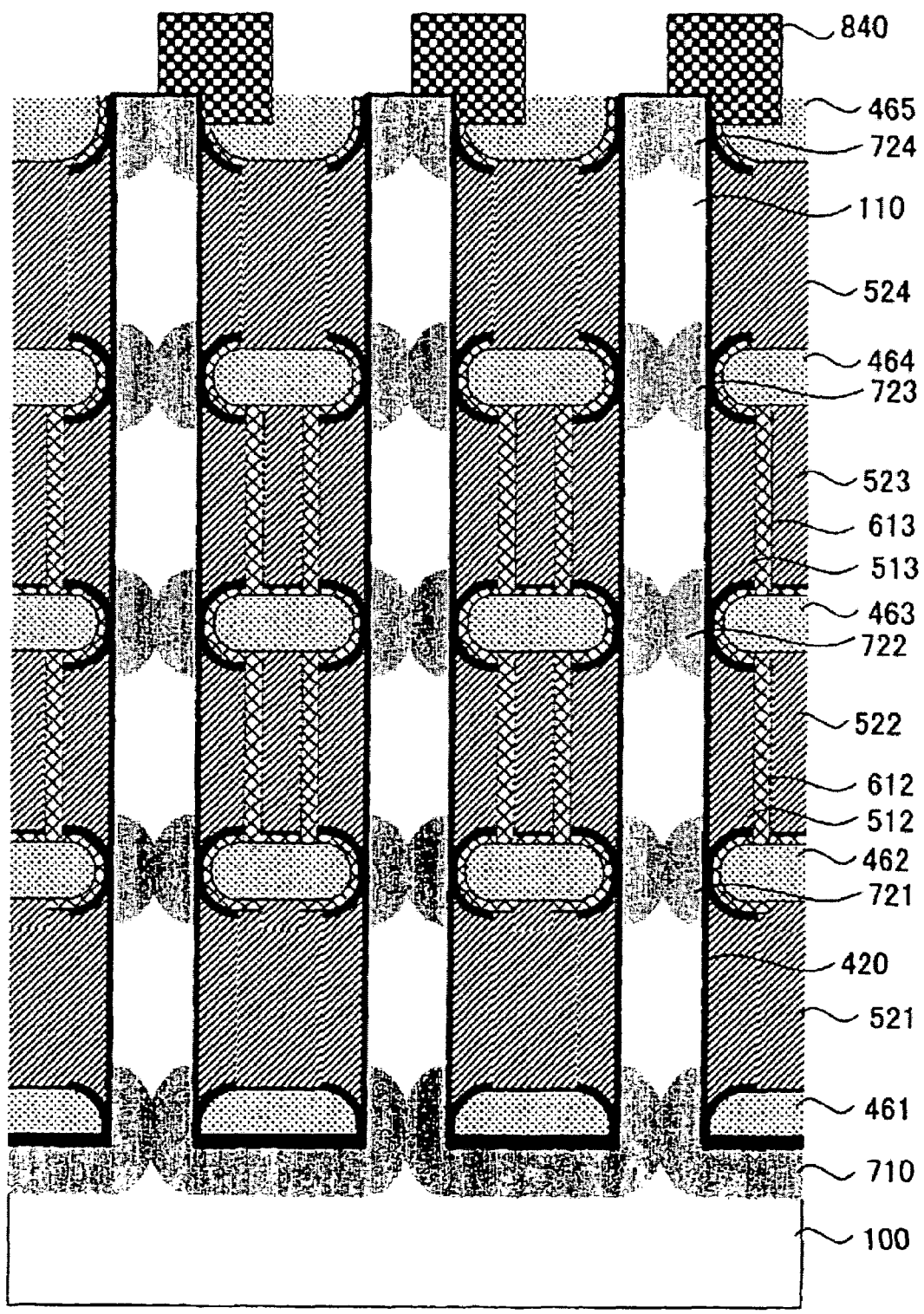

Then, oxide films (eighth insulation films) 464 are formed as covering side surfaces and upper surfaces of the polycrystalline silicon films (second electrically conductive films) 523. Polycrystalline silicon films (second electrically conductive films) 524 are formed on the peripheral surfaces of the uppermost polycrystalline silicon films (first electrically conductive films) 514, and etched back to such an extent as to respectively contact the uppermost polycrystalline silicon films (first electrically conductive films) 514 like the lowermost polycrystalline silicon films (first electrically conductive films) 511. A silicon oxide film (tenth insulation film) 465 is formed on the upper surfaces of the polycrystalline silicon films (second electrically conductive films) 524, and etched back or partly polished away by CMP, whereby the upper surfaces of the respective island semiconductor layers 110 respectively formed with the impurity diffusion layers 724 are exposed. Then, bit lines (fourth interconnection layers) 840 are formed as intersecting the second and third interconnection layers and connected to the upper portions of the island semiconductor layers 110 (FIG. 27). In FIG. 27, the fourth interconnection lines 840 are illustrated as disposed on the impurity diffusion layers 724 without misalignment. Even if the misalignment occurs, the fourth interconnection layers 840 can assuredly be connected to the impurity diffusion layers 724 as shown in FIG. 28.

Thereafter, an inter-level insulation film is formed, and then contact holes and metal interconnections are formed by known techniques. Thus, nonvolatile memory devices are produced, which each include charge storage layers each including a floating gate constituted by the first electrically conductive film (polycrystalline silicon film) and have a memory function based on the charge injection state of the charge storage layers.

Second Embodiment

Figure 29:
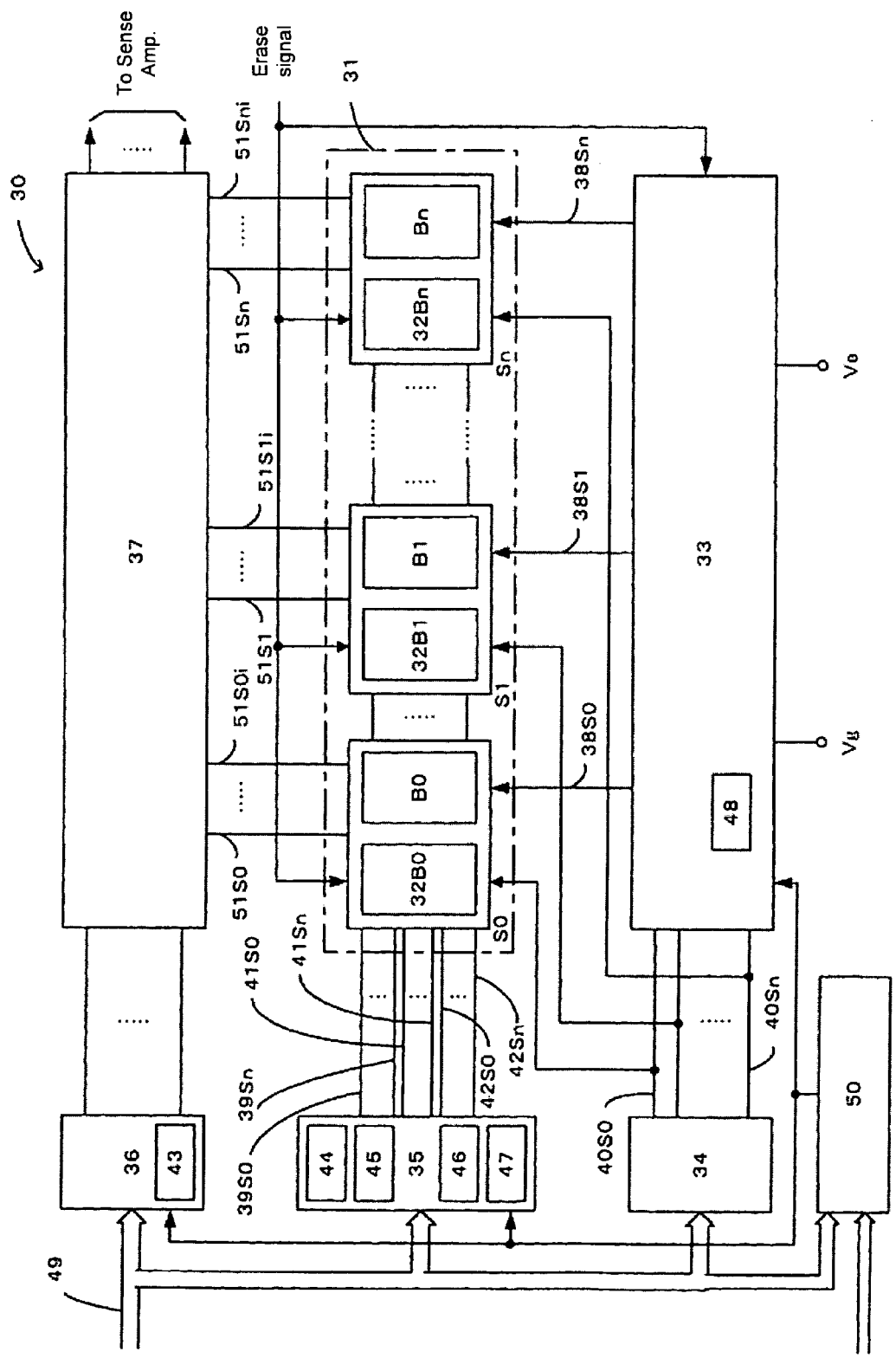
FIG. 29 is a block diagram of the semiconductor storage device according to the present invention.

An exemplary circuit configuration of a semiconductor storage device according to the present invention will be described with reference to FIG. 29. FIG. 29 is a block diagram of the semiconductor storage device 30 according to the invention. The semiconductor storage device 30 includes a plurality of memory cell arrays 31 which each include a plurality of nonvolatile memory devices each including a plurality of memory cells for storing data.

The memory cell arrays 31 are respectively disposed in blocks B0 to Bn. The blocks B0 to Bn respectively include local row decoders 32B0 to 32Bn. For example, the block B0 includes the local row decoder 32B0. The blocks B0 to Bn each include a plurality of bit lines 51S0 to 51S0$i$, 51S1 to 51S1$i$, . . . , 51Sn to 51Sn$i$ extending therein, and a plurality of local word lines (not shown) extending therein. The memory cells are respectively disposed at intersections of the local word lines and the bit lines. The bit lines for the respective memory cell arrays 31 are connected to a column decoder 36 via a column gate circuit 37.

Figure 30:
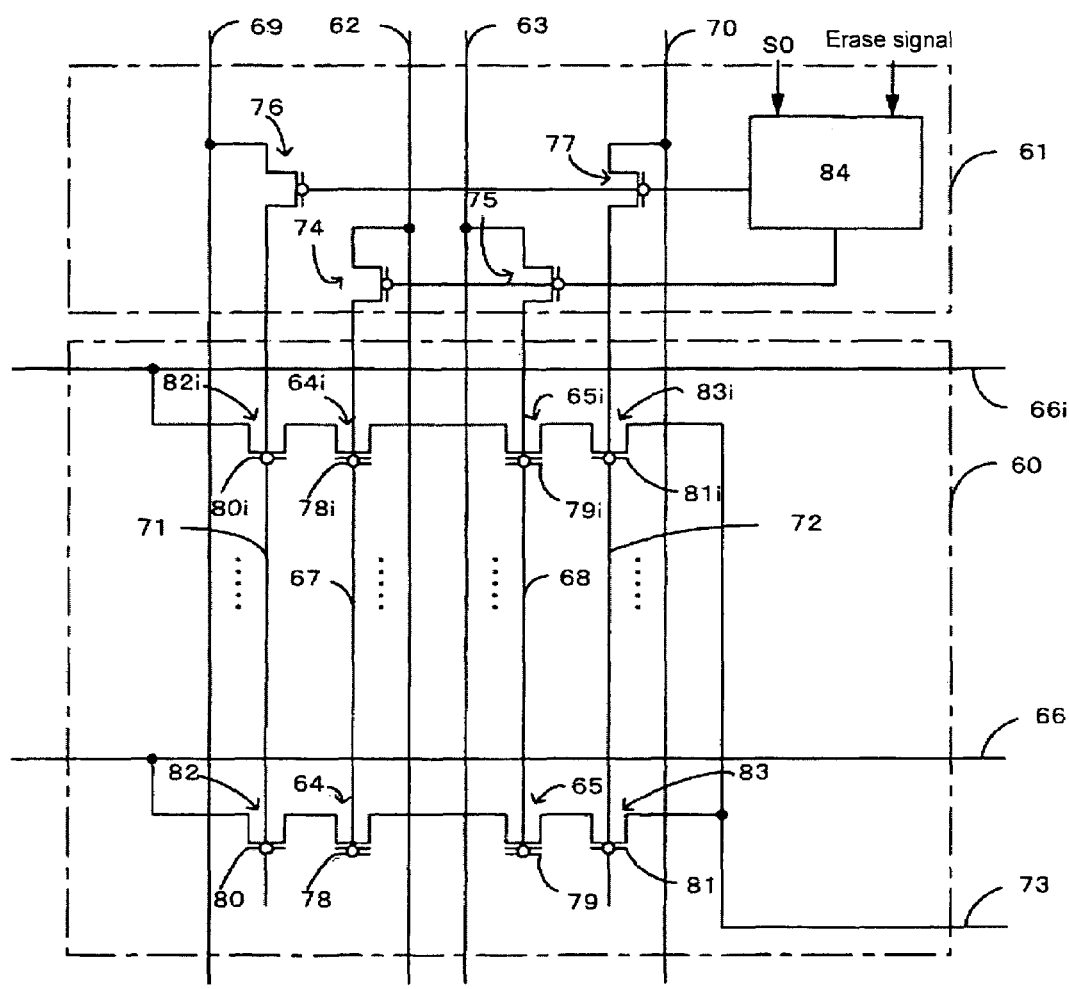
FIG. 30 is a block diagram of the memory cell array each of which is indicated as block B0 to Bn in FIG. 29.

The local word lines of each of the blocks B0 to Bn are connected to the corresponding local row decoder 32B0 to 32Bn associated with the block B0 to Bn. Further, the memory cell arrays 31 include global word lines 39S0 to 39Sn connected to a global row decoder 35. The global word lines 39S0 to 39Sn are connected to each of the local row decoders 32B0 to 32Bn and extend through the respective blocks B0 to Bn. The global word lines 39S0 to 39Sn are not physically connected to the local word lines of the respective blocks B0 to Bn, but are adapted to be electrically connected to the local word lines of the respective blocks B0 to Bn via the local row decoders 32B0 to 32Bn associated with the blocks B0 to Bn. FIG. 30 illustrates each of the memory cell arrays in the blocks B0 to Bn to be described later.

The global row decoder 35 is a row decoder for the memory cell arrays 31, and is adapted to select one of the global word lines 39S0 to 39Sn on the basis of a row address applied through an address bus 49. The local row decoders 32B0 to 32Bn each include a plurality of switching transistors (not shown) which respectively connect the local word lines to the corresponding global word lines 39S0 to 39Sn. The local row decoders 32B0 to 32Bn are each adapted to receive a block selection signal from a block decoder 34. For example, the local row decoder 32B0 receives a block selection signal S0. When the block selection signals are outputted to the local row decoders 32B0 to 32Bn, the switching transistors (not shown) of the respective local row decoders 32B0 to 32Bn are all turned on. When the block selection signals are not outputted to the local row decoders 32B0 to 32Bn, the switching transistors of the respective local row decoders 32B0 to 32Bn are all in an off state. During a memory processing period, the local word lines of each of the blocks B0 to Bn are isolated from the global word lines 39S0 to 39Sn, and isolated from the local word lines of the other blocks. The local row decoders 32B0 to 32Bn are each adapted to receive an erase control signal, i.e., an erase signal. The block decoder 34 is adapted to output one of the block selection signals S0 to Sn to select the corresponding block. Further, the block decoder 34 is connected to the bus 49 for receiving a block address.

The blocks B0 to Bn each include first and second local selection lines (not shown) extending therein. The first and second local selection lines of the respective blocks B0 to Bn are connected to the corresponding local row decoders 32B0 to 32Bn. The memory cell arrays 31 further include a plurality of first global selection lines 41S0 to 41Sn and a plurality of second global selection lines 42S0 to 42Sn connected to the global row decoder 35. The first global selection lines 41S0 to 41Sn and the second global selection lines 42S0 to 42Sn are connected to each of the local row decoders 32B0 to 32Bn and extend through the respective blocks B0 to Bn. The first global selection lines 41S0 to 41Sn and the second global selection lines 42S0 to 42Sn are not physically connected to the first and second selection lines of the respective blocks B0 to Bn of the memory cell arrays 31, but are adapted to be electrically connected to the first and second local selection lines of the respective blocks B0 to Bn via the local row decoders 32B0 to 32Bn associated with the blocks B0 to Bn.

An erase switch 33 includes a plurality of switches (not shown in FIG. 29), which are respectively connected to common source lines 38S0 to 38Sn of the blocks B0 to Bn. On the basis of a block selection signal applied through one of the block selection lines 40S0 to 40Sn, the switches of the erase switch 33 connect a voltage (ground voltage) Vg or an erase voltage selectively to the corresponding one of the common source lines 38S0 to 38Sn in the blocks B0 to Bn in the memory processing operations (i.e., reading, writing and erasing operations). Where the semiconductor storage device 30 is subjected to the reading or writing operation, the switches of the erase switch 33 apply the voltage Vg to all the common source lines 38S0 to 38Sn irrespective of the block selection signals S0 to Sn. Where the semiconductor storage device 30 is subjected to the erasing operation on the basis of the erase signal, the block decoder 34 outputs a block selection signal indicative of a selected block and applies the erase voltage to the selected block through the corresponding one of the switches of the erase switch 33. On the other hand, the other switches of the erase switch apply the voltage Vg to the other blocks.

FIG. 30 illustrates a block 60 and a local row decoder 61 associated with the block 60. The block 60 is one of the blocks B0 to Bn in FIG. 29. The local row decoder 61 is one of the local row decoders 32B0 to 32Bn associated with the block 60. In FIG. 30, only global word lines 62 and 63 are shown which extend through the block 60. The global word lines 62, 63 are two of the global word lines 39S0 to 39Sn in FIG. 29.

The block 60 includes bit lines 66 to 66$i$. The block 60 further includes a first local word line 68 associated with the global word line 63 and a second local word line 67 associated with the global word line 62. The first local word line 68 is connected to the first global word line 63 via a switching transistor 75 of the local row decoder 61, while the second local word line 67 is connected to the second global word line 62 via a switching transistor 74 of the local row decoder 61.

The block 60 further includes a first local selection line 72 connected to first selection gates 81 to 81$i$ of first selection transistors 83 to 83$i$ of the respective nonvolatile memory devices, and a second local selection line 71 connected to second selection gates 80 to 80$i$ of second selection transistors 82 to 82$i$ of the respective nonvolatile memory devices. For example, the first local selection line 72 is connected to a first global selection line 70 via a switching transistor 77 of the local row decoder 61, while the second local section line 71 is connected to a second global selection line 69 via a switching transistor 76 of the local row decoder 61.

The block 60 has a common source line 73, which is connected one of the switches of the erase switch 33 (FIG. 29). The block 60 further includes memory cells 64 to 64$i$ and 65 to 65$i$. The memory cells 65 to 65$i$ respectively have first control gates 79 to 79$i$, while the memory cells 64 to 64$i$ respectively have second control gates 78 to 78$i$. The nonvolatile memory devices each have a drain connected to the bit line 66 to 66$i$, and a source connected to the common source line 73.

The column decoder 36 shown in FIG. 29 includes a drain voltage generating section 43 which generates voltages to be applied to the drains of the nonvolatile memory devices, and is adapted to drive the bit lines 51S0 to 51S0$i$, 51S1 to 51S1$i$, . . . , 51Sn to 51Sn$i$ (66 to 66$i$ in FIG. 30) connected to the drains of the nonvolatile memory devices via the column gate circuit 37. The global row decoder 35 includes a first control gate voltage generating section 44 which generates voltages to be applied to the first control gates (79 to 79$i$ in FIG. 30), and a second control gate voltage generating section 45 which generates voltages to be applied to the second control gates (78 to 78$i$ in FIG. 30), and is adapted to drive the local word lines (67, 68 in FIG. 30) respectively connected to the first and second control gates (79 to 79$i$ and 78 to 78$i$ in FIG. 30) of memory cells selected via the local row decoders 32B0 to 32Bn (61 in FIG. 30). The global row decoder 35 further includes a first selection gate voltage generating section 46 which generates voltages to be applied to the first selection gates (81 to 81$i$ in FIG. 30), and a second selection gate voltage generating section 47 which generates voltages to be applied to the second selection gates (80 to 80$i$ in FIG. 30), and is adapted to drive the first and second local selection lines 72, 71 respectively connected to the first and second selection gates (81 to 81$i$ and 80 to 80$i$ in FIG. 30) via the local row decoders 32B0 to 32Bn (61 in FIG. 30). The erase switch 33 includes a source voltage generating section 48 which generates voltages to be applied to the sources of the memory devices, and is adapted to drive the common source line 73 connected to the sources of the memory devices.

The semiconductor storage device 30 further includes a state controlling section 50 which controls signals and voltages to be generated in the semiconductor storage device 30 and the timing for application of the signals and the voltages according to control information applied from the outside of the semiconductor storage device 30.

Third Embodiment

An explanation will be given to a writing operation in which electric charges are injected into a charge storage layer of a nonvolatile memory device according to the present invention.

Figure 3:
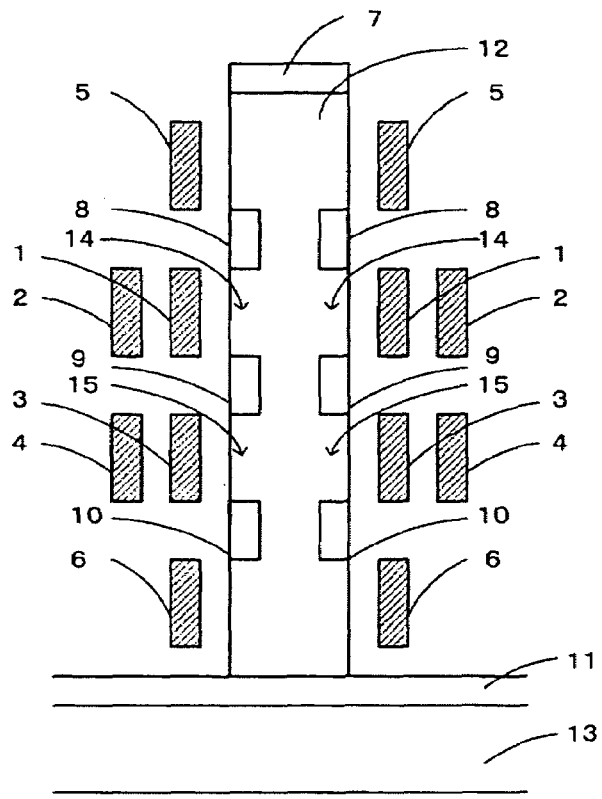
FIG. 3 is a sectional view of one embodiment of a nonvolatile memory device according to the present invention.
Figure 4:
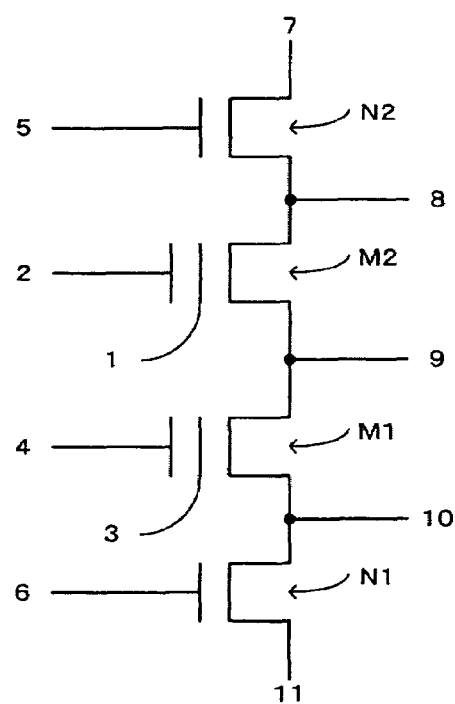
FIG. 4 is an equivalent circuit diagram of the nonvolatile memory device shown in FIG. 3.

FIG. 3 is a sectional view of a nonvolatile memory device provided in association with a single island semiconductor layer. FIG. 4 is an equivalent circuit diagram of the nonvolatile memory device, which is equivalent to each of the nonvolatile memory devices constituting the memory cell array shown in FIG. 30. The nonvolatile memory device of FIG. 3 includes two memory cells M1, M2 each having a charge storage layer 1, 3 and a control gate 2, 4 provided around the P-type island semiconductor layer 12 electrically isolated from the P-type semiconductor substrate 13, and two selection transistors N1, N2. An explanation will be given to voltages to be applied to the respective terminals when the electric charges are injected into either of the charge storage layers 1, 3 of the memory cells M1, M2 in the nonvolatile memory device in the memory cell array for the writing operation.

It is herein assumed that the first and second local selection lines 72, 71, the first and second local word lines 68, 67 and the bit line 66$i$ are selected in the memory cell array shown in FIG. 30. That is, the first and second local selection lines 72, 71, the first and second local word lines

68, 67 and the bit line 66*i* are respectively connected to the first and second selection gate voltage generating sections 46, 47, the first and second control gate voltage generating sections 44, 45 and the drain voltage generating section 43. Thus, a voltage generated by the first control gate voltage generating section 44 is applied to the first control gate 4 of the nonvolatile memory device via the first local word line 68. Similarly, a voltage generated by the second control gate voltage generating section 45 is applied to the second control gate 2 of the nonvolatile memory device via the second local word line 67. Further, voltages generated by the first and second selection gate voltage generating sections 46, 47 and the drain voltage generating section 43 are respectively applied to the first and second selection gates 6, 5 and the drain 7 via the first and second local selection lines 72, 71 and the bit line 66*i*. Further, a voltage generated by the source voltage generating section 48 is applied to the source 11 via the common source line 73.

Electric charges are injected into the charge storage layer 3 of the memory cell M1 the nonvolatile memory device shown in FIG. 4 by an FN tunnel current in the following manner for the writing operation. First, a high voltage VH1 is applied to the first control gate 4, and a voltage VH2 (VH1>VH2) such as to prevent the writing is applied to the second control gate 2. A positive voltage VH3 is applied to the second selection gate 5, and a negative voltage VN1 such as to prevent electrical connection to the source 11 is applied to the first selection gate 6. The source 11 is grounded, and a negative voltage VN1 is applied to the drain 7.

For the other memory devices not subjected to the charge injection in the selected block, a positive voltage is applied to the drain 7 (bit line) of each of the memory devices, or the drain 7 is grounded for prevention of the writing. By the application of the negative voltage VN1 to the drain 7, the N-type diffusion layers 8, 9, 10 are kept at the negative voltage VN1. Then, a first floating channel 15 (FIG. 3) formed in a region of the island semiconductor layer 12 opposed to the charge storage layer 3 with the intervention of an insulation film is charged at the negative voltage VN1, whereby a potential difference of VH1–VN1 occurs between the first control gate 4 and the first floating channel 15. At this time, electric charges are injected into the charge storage layer 3 from the first floating channel 15 by an FN tunnel current. Thus, the threshold voltage of the memory cell M1 is positively shifted by the injection of the electric charges. However, the application of the negative voltage VN1 to the first selection gate 6 prevents the electrical connection between the N-type diffusion layer 10 and the source 11, thereby preventing the flow of an excessive electric current from the source 11 to the drain 7 to which the negative voltage is applied. Since the electric charges are not injected into the charge storage layer 1 of the memory cell M2, the threshold voltage of the memory cell M2 is not changed. In this manner, the electric charges are injected into the charge storage layer 3 of the lower memory cell M1 in the selected block by the FN tunnel current for the writing operation.

On the other hand, the injection of electric charges into the charge storage layer 1 of the upper memory cell M2 in the block is carried out in the following manner for the writing operation. A high voltage VH1 is applied to the second control gate 2, and a voltage VH2 (VH1>VH2) such as to prevent the writing is applied to the first control gate 4. A positive voltage VH3 is applied to the second selection gate 5, and a negative voltage VN1 such as to prevent electrical connection to the source 11 is applied to the first selection gate 6. The source 11 is grounded, and a negative voltage VN1 is applied to the drain 7 into which electric charges are injected.

For the other memory devices not subjected to the charge injection in the selected block, a positive voltage is applied to the drain 7 (bit line) of each of the memory devices, or the drain 7 is grounded for prevention of the writing. By the application of the negative voltage VN1 to the drain 7, the N-type diffusion layers 8, 9, 10 are kept at the negative voltage VN1. A second floating channel 14 (FIG. 3) formed in a region of the island semiconductor layer 12 opposed to the charge storage layer 1 with the intervention of an insulation film is charged at the negative voltage VN1, whereby a potential difference of VH1–VN1 occurs between the second control gate 2 and the second floating channel 14. At this time, electric charges are injected into the charge storage layer 1 from the second floating channel 14 by an FN tunnel current. Thus, the threshold voltage of the memory cell M2 is positively shifted by the injection of the electric charges. However, the application of the negative voltage VN1 to the first selection gate 6 prevents the electrical connection between the N-type diffusion layer 10 and the source 11, thereby preventing the flow of an excessive electric current from the source 11 to the drain 7 to which the negative voltage is applied. Since the electric charges are not injected into the charge storage layer 3 of the memory cell M1, the threshold voltage of the memory cell M1 is not changed. In this manner, the voltages are applied to the respective terminals in the writing operation.

Figure 2:
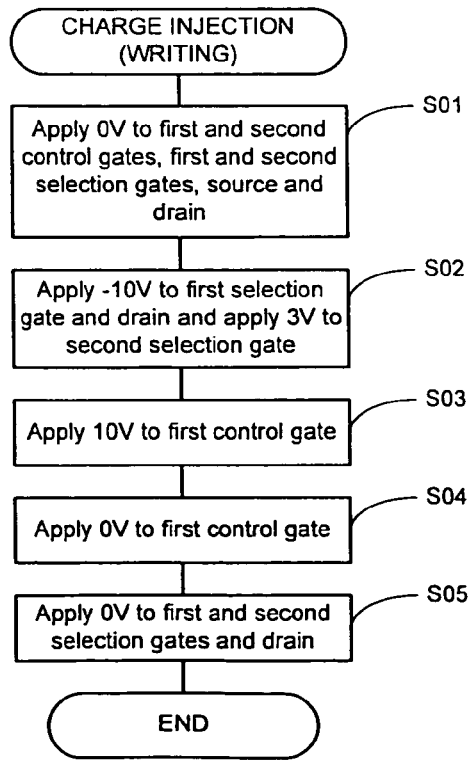
FIG. 2 is a flow chart for the process of the writing operation for a nonvolatile memory device according to the present invention.

Next, a preferred process for the writing operation will be described. FIG. 1 is a timing chart for the application of the voltages to the respective terminals according to this embodiment. FIG. 2 is a flow chart for the process for the writing operation according to this embodiment. With reference to the flow chart of FIG. 2, an explanation will be given to the process for the writing operation.

First, 0V is applied to the first and second control gates 4, 2, the first and second selection gates 6, 5, the source 11 and the drain 7 (Step S01). Then, –10V, 3V and –10V are applied to the drain 7, the second selection gate 5 and the first selection gate 6, respectively, with the second control gate 2 being kept at 0V (Step S02). Thereafter, 10V is applied to the first control gate 4 (Step S03). At this time, electric charges are injected into the charge storage layer 3 from the first floating channel 15 by the FN tunnel current. For the other memory devices not subjected to the writing operation in the selected block, 0V is applied to the drain 7 (bit line) of each of the memory devices for prevention of the writing.

After the completion of the writing, 0V is applied to the first control gate 4 (Step S04). Then, 0V is applied to the first and second selection gates 6, 5 and the drain 7 (Step SO5). In this embodiment, the voltages applied to the first and second selection gates 6, 5 and the drain 7 are simultaneously changed. However, these voltages are not necessarily required to be simultaneously changed, but may be changed in a time-staggered manner.

Fourth Embodiment

An explanation will be given to voltages to be applied to the respective terminals when electric charges are released from the charge storage layers of the memory cells of the nonvolatile memory device for the erasing operation according to the present invention.

Where electric charges are to be released from the charge storage layer of each of the memory cells in the selected block, a preparatory operation is performed by applying a positive voltage VH5 to the drain 7, applying a positive voltage VH4 (VH4>VH5) such as to permit passage of the positive voltage VH5 to the second selection gate 5, applying a positive voltage VH4 to the first control gate 4 and the second control gate 2, and grounding the first selection gate 6 and the source 11. Thus, the second selection gate 5, the first control gate 4 and the second control gate 2 are turned on and the N-type diffusion layers 8, 9, 10 are kept at VH5, whereby the first and second floating channels 15, 14 are charged at VH5. After the completion of the charging, the voltages applied to the first and second control gates 4, 2 are changed from the positive voltage VH4 to a negative voltage VN1 for the release of the electric charges, whereby a potential difference of VN1–VH5 occurs between the first control gate 4 and the first floating channel 15 and between the second control gate 2 and the second floating channel 14. At this time, the electric charges are released from the charge storage layers 3, 1 to the first and second floating channels 15, 14 by an FN tunnel current. Thus, the threshold voltages of the memory cells M1, M2 are negatively shifted by the release of the electric charges. In this manner, a first exemplary process for the erasing operation is performed.

Figure 31:
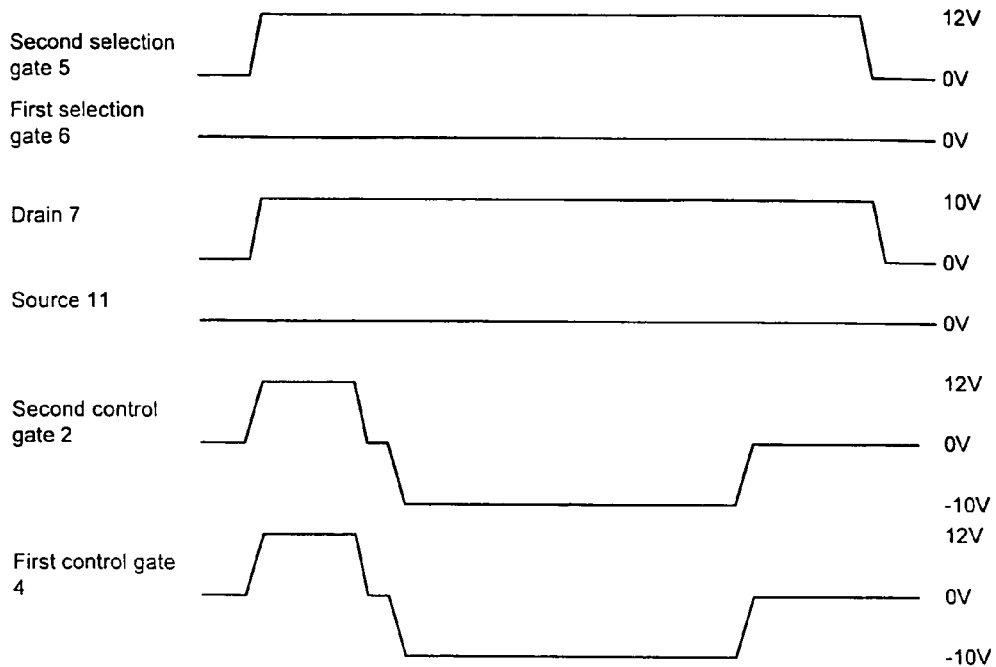
FIG. 31 is a timing chart for the application of the respective voltages in the first exemplary process of the erasing operation according to the present invention.
Figure 32:
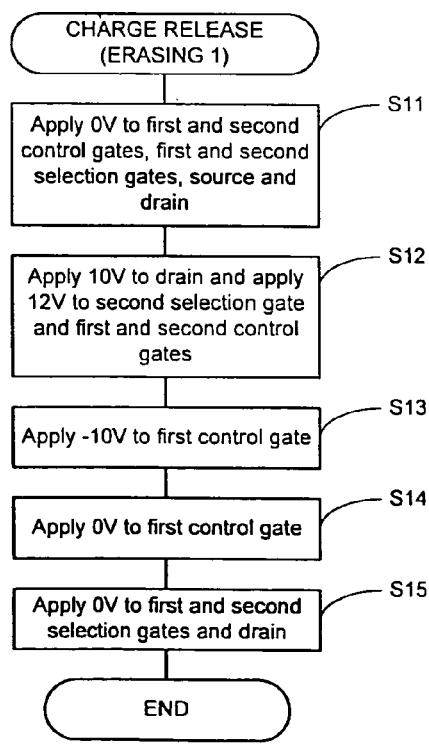
FIG. 32 is a flow chart for the first exemplary process of the erasing operation shown in FIG. 31.

The first exemplary process for the erasing operation will be described more specifically with reference to a flow chart shown in FIG. 32. The timing chart for the application of the respective voltages is shown in FIG. 31. Where the memory cells in the selected block are each subjected to the erasing operation, 0V is first applied to the first and second control gates 4, 2, the first and second selection gates 6, 5, the source 11 and the drain 7 (Step S11). Then, 10V is applied to the drain 7, and 12V is applied to the second selection gate 5 and the first and second control gates 4, 2, whereby the first and second floating channels 15, 14 are charged (Step S12). After the completion of the charging, –10V is applied to the first and second control gates 4, 2 (Step S13). After the completion of the erasing, 0V is applied to the first and second control gates 4, 2 (Step S14). Thereafter, 0V is applied to the second selection gate 5 and the drain 7 (Step S15).

Where the memory cells in the selected block are to be selectively subjected to the erasing operation, 0V is applied to the drain 7 or to the first and second control gates 4, 2 of each of the memory devices not subjected to the erasing operation for prevention of the erasing. After the completion of the erasing, 0V is applied to the first and second control gates 4, 2 and then to the second selection gate 5 and the drain 7. The voltages applied to the second selection gate 5 and the drain 7 are simultaneously changed in FIG. 31. However, these voltages are not necessarily required to be simultaneously changed, but may be changed in a time-staggered manner. Further, the source 11 and the first selection gate 6 are not necessarily required to be grounded, but a positive voltage may be applied thereto.

Next, a second exemplary process for the erasing operation will be described. In the second process for the erasing operation, 10V is applied from the source 11. In this process, the memory cells can be subjected to the erasing operation as in the first process. Where the electric charges are to be released from the charge storage layer of each of the memory cells in the selected block in the second process, a preparatory operation for the release of the electric charges is performed by applying a positive voltage VH5 to the source 11, applying a positive voltage VH4 (VH4>VH5) such as to permit passage of the positive voltage VH5 to the first selection gate 6, applying a positive voltage VH4 to the first control gate 4 and the second control gate 2, and grounding the second selection gate 5 and the drain 7. Thus, the second selection gate 5, the first control gate 4 and the second control gate 2 are turned on and the N-type diffusion layers 8, 9, 10 are kept at VH5, whereby the first and second floating channels 15, 14 are charged at VH5. After the completion of the charging, the voltages applied to the first and second control gates 4, 2 are changed from the positive voltage VH4 to a negative voltage VN1 for the release of the electric charges, whereby a potential difference of VN1–VH5 occurs between the first control gate 4 and the first floating channel 15 and between the second control gate 2 and the second floating channel 14. At this time, the electric charges are released from the charge storage layers 1, 3 to the first and second floating channels 15, 14 by the FN tunnel current. Thus, the threshold voltages of the memory cells M1, M2 are negatively shifted by the release of the electric charges. In this manner, the second exemplary process for the erasing operation is performed.

Figure 33:
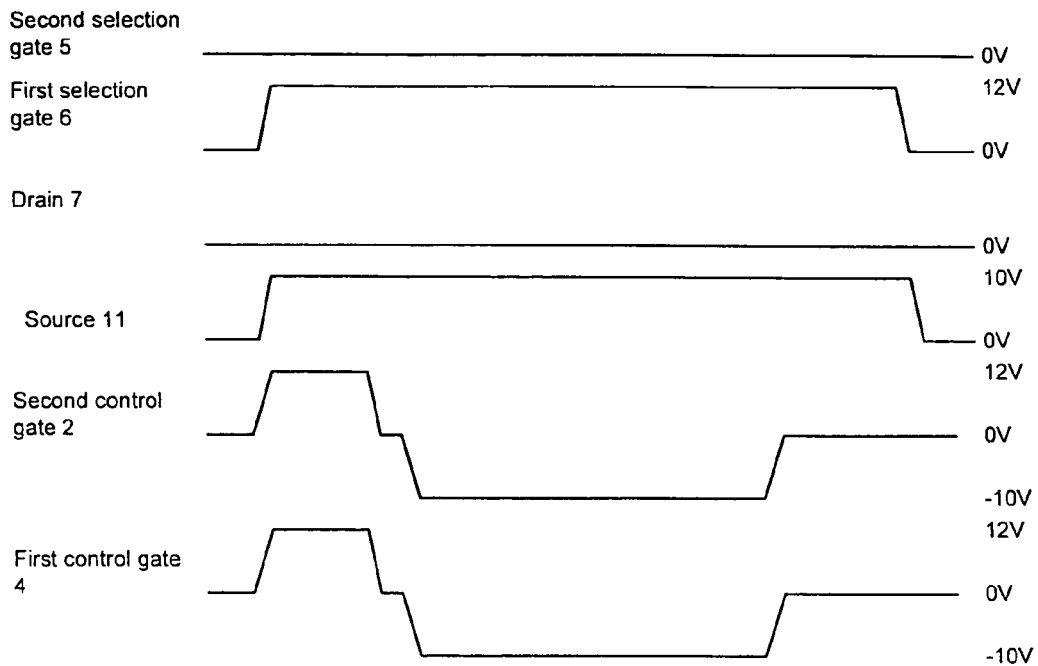
FIG. 33 is a timing chart for the application of the respective voltages in the second exemplary process of the erasing operation according to the present invention.
Figure 34:
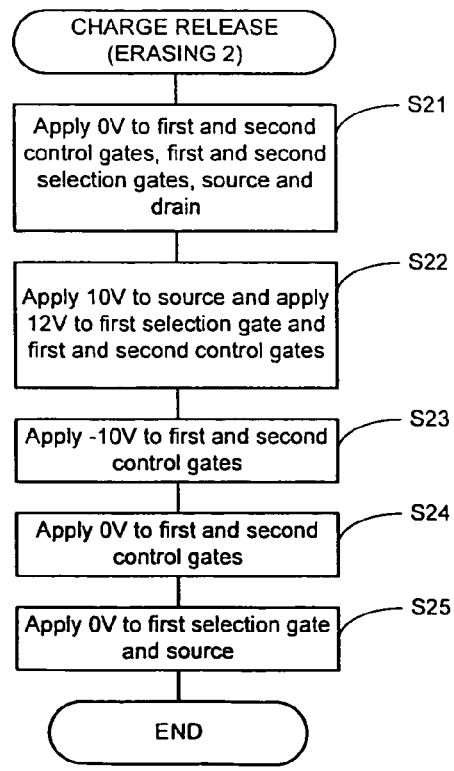
FIG. 34 is a flow chart for the second exemplary process of the erasing operation shown in FIG. 33.

The second exemplary process for the erasing operation will be described more specifically with reference to a flow chart shown in FIG. 34. A timing chart for the application of the respective driving voltages is shown in FIG. 33. Where the memory cells M1, M2 connected to the first and second control gates 4, 2 are to be subjected to the erasing operation, 0V is first applied to the first and second control gates 4, 2, the first and second selection gates 6, 5, the source 11 and the drain 7 (Step S21). Then, 10V is applied to the source 11, and 12V is applied to the first selection gate 6 and the first and second control gates 4, 2, whereby the first and second floating channels 15, 14 are charged (Step S22). After the completion of the charging, –10V is applied to the first and second control gates 4, 2 (Step S23). After the completion of the erasing, 0V is applied to the first and second control gates 4, 2 (Step S24). Thereafter, 0V is applied to the second selection gate 5 and the drain 7 (Step S25). In this manner, the memory cells M1, M2 are subjected to the erasing operation. In this process, the voltages applied to the first selection gate 6 and the source 11 are simultaneously changed. However, these voltages are not necessarily required to be simultaneously changed, but may be changed in a time-staggered manner. Further, the drain 7 and the second selection gate 5 are not necessarily required to be grounded, but a positive voltage may be applied thereto.

Next, a third exemplary process for the erasing operation will be described. In the third process for the erasing operation, a voltage is applied from the drain 7 and the common source 11. Where the electric charges are to be released from the charge storage layer of each of the memory cells in the selected block in the third process, a preparatory operation for the release of the electric charges is performed by applying a positive voltage VH5 to the drain 7 and the source 11, applying a positive voltage VH4 (VH4>VH5) such as to permit passage of the positive voltage VH5 to the first and second selection gates 6, 5, and applying a positive voltage VH4 to the first control gate 4 and the second control gate 2. Thus, the first and second selection gates 6, 5, the first control gate 4 and the second control gate 2 are turned on and the N-type diffusion layers 8, 9, 10 are kept at VH5, whereby the first and second floating channels 15, 14 are charged at VH5. After the completion of the charging, the voltages applied to the first and second control gates 4, 2 are changed from the positive voltage VH4 to a negative voltage VN1 for the release of the electric charges, whereby a potential difference of VN1–VH5 occurs between the first control gate 4 and the first floating channel 15 and between the second control gate 2 and the second floating channel 14. At this time, the electric charges are released from the charge storage layers 3, 1 to the first and second floating channels 15, 14 by a tunnel current. Thus, the threshold voltages of the memory cells M1, M2 are negatively shifted by the release of the electric charges. In this manner, the third exemplary process for the erasing operation is performed.

Figure 35:
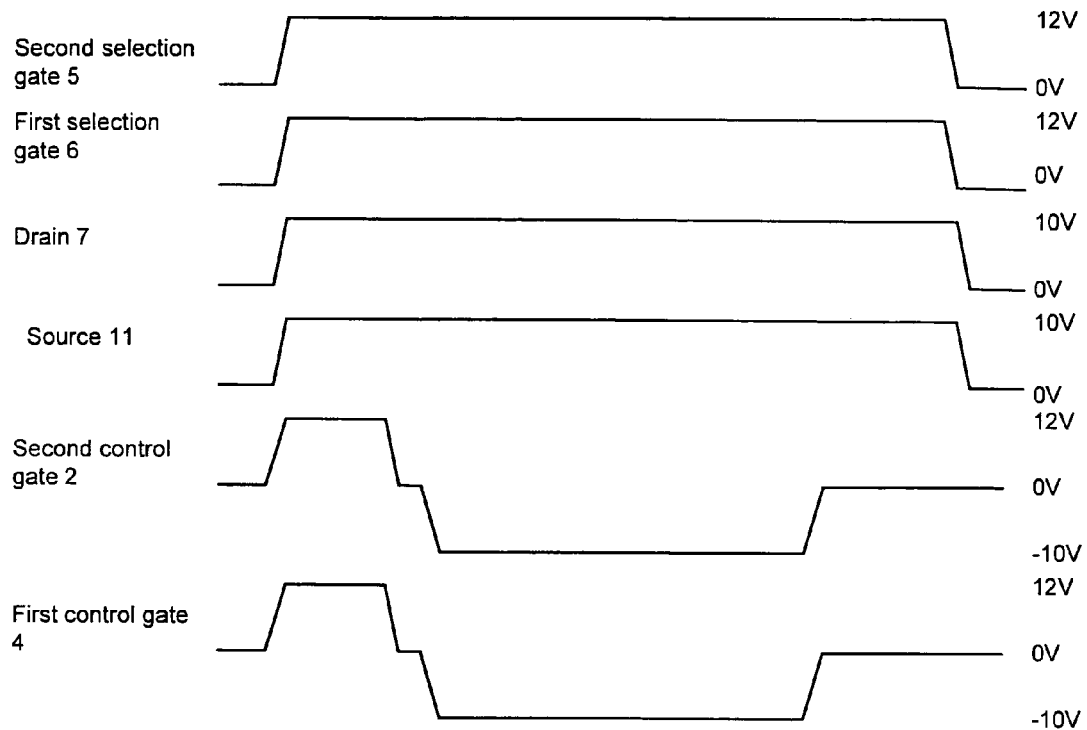
FIG. 35 is a timing chart for the application of the respective voltages in the third exemplary process of the erasing operation according to the present invention.
Figure 36:
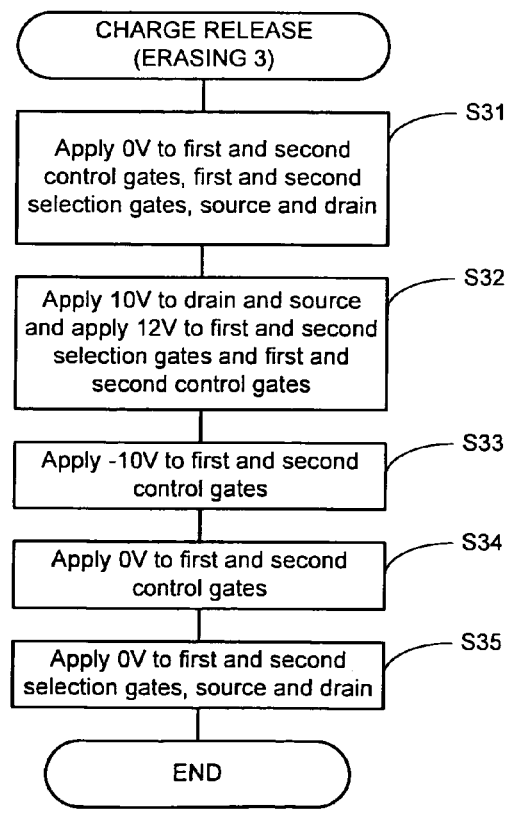
FIG. 36 is a flow chart for the third exemplary process of the erasing operation shown in FIG. 35.

The third process for the erasing operation will be described more specifically with reference to a flow chart shown in FIG. 36. A timing chart for the application of the respective voltages is shown in FIG. 35.

Where the memory cells in the selected block are to be each subjected to the erasing operation, 0V is first applied to the first and second control gates 4, 2, the first and second selection gates 6, 5, the source 11 and the drain 7 (Step S31). Then, 10V is applied to the drain 7 and the source 11, and 12V is applied to the first and second selection gates 6, 5 and the first and second control gates 4, 2, whereby the first and second floating channels 15, 14 are charged (Step S32). After the completion of the charging, −10V is applied to the first and second control gates 4, 2 (Step S33). After the completion of the erasing, 0V is applied to the first and second control gates 4, 2 (Step S34). Thereafter, 0V is applied to the first and second selection gates 6, 5, the source 11 and the drain 7 (Step S35). In this manner, the memory cells M1, M2 are subjected to the erasing operation. In this process, the voltages applied to the first and second selection gates 6, 5, the drain 7 and the source 11 are simultaneously changed. However, these voltages are not necessarily required to be simultaneously changed, but may be changed in a time-staggered manner.

The third process for the erasing operation provides a higher channel charging capability to permit higher speed erasing than the first and second processes.

Fifth Embodiment

An explanation will be given to a writing operation in which electric charges are injected into a charge storage layer of a nonvolatile memory device according to another embodiment according to the present invention.

Figure 5:
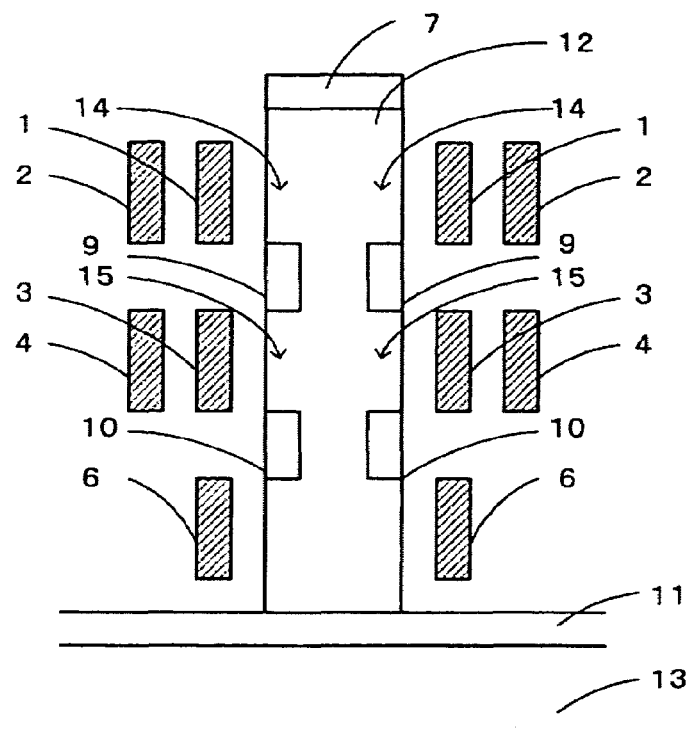
FIG. 5 is a sectional view of another embodiment of the nonvolatile memory device according to the present invention.
Figure 6:
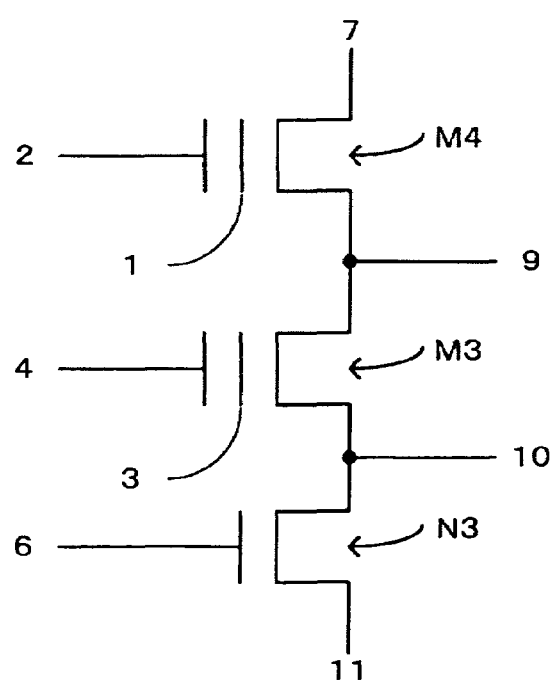
FIG. 6 is an equivalent circuit diagram of the nonvolatile memory device shown in FIG. 5.
Figure 7:
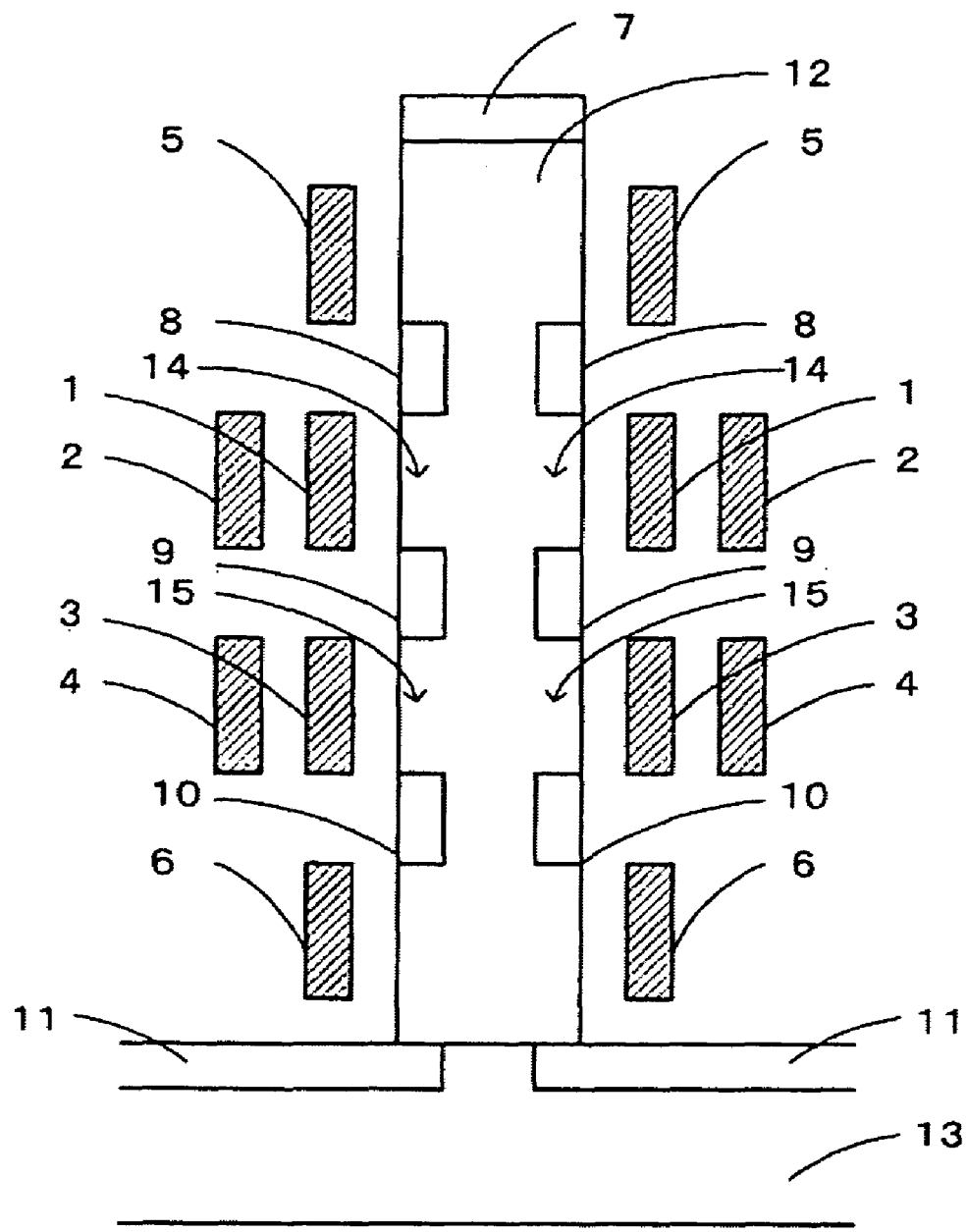
FIG. 7 is a sectional view of a nonvolatile memory device of the prior art.
Figure 37:
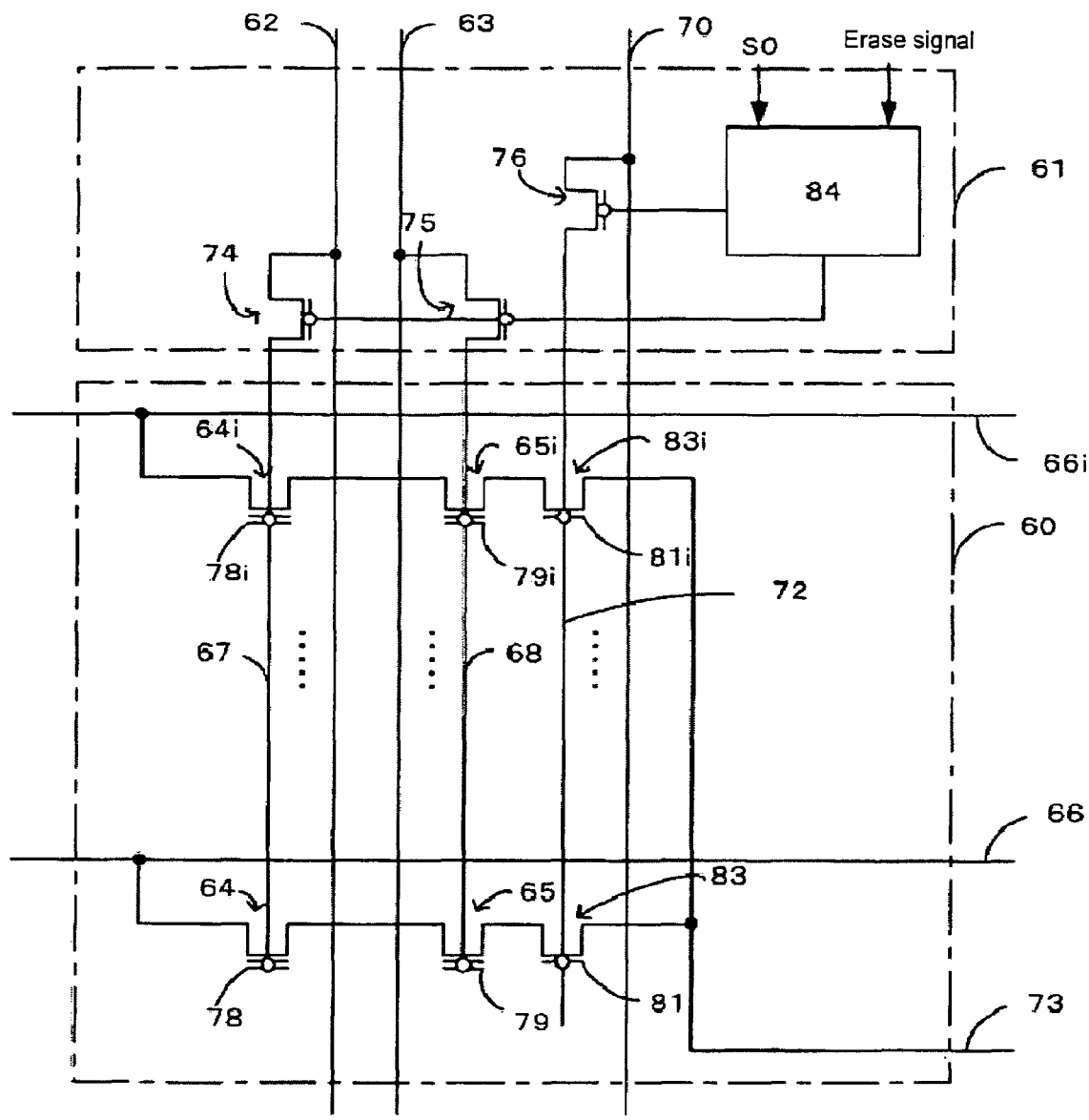
FIG. 37 is a diagram illustrating a memory cell array including a plurality of nonvolatile memory devices according to the present invention.

FIG. 5 is a sectional view of the nonvolatile memory device according to this embodiment. FIG. 6 is an equivalent circuit diagram of the nonvolatile memory device. FIG. 37 is a diagram illustrating a memory cell array including a plurality of such nonvolatile memory devices. The nonvolatile memory device includes one or more memory cells (two memory cells M3, M4 in this embodiment) and a single selection transistor N3 (hereinafter referred to as "first selection transistor" for easy understanding of the correspondence with the first selection transistor provided in the memory device shown in FIG. 3) which are provided in association with a P-type column semiconductor layer 12 electrically isolated from a P-type semiconductor substrate 13. The memory cell array shown in FIG. 37 has substantially the same configuration as the memory cell array (FIG. 30) constituted by the nonvolatile memory devices shown in FIG. 4, except that the second global selection line 69 and the second local selection line 71 are not provided.

An explanation will be given to voltages to be applied to the respective terminals when the electric charges are injected into the charge storage layers of the memory cells in the memory cell array shown in FIG. 37 for the writing operation.

It is herein assumed that the first local selection line 72, the first and second local word lines 68, 67 and the bit line 66i are selected. That is, the first local selection line 72, the first and second local word lines 68, 67 and the bit line 66i are respectively connected to the first selection gate voltage generating section 46, the first and second control gate voltage generating sections 44, 45 and the drain voltage generating section 43. Thus, a voltage generated by the first control gate voltage generating section 44 is applied to the first control gate 4 of the nonvolatile memory device via the firs local word line 68. Similarly, a voltage generated by the second control gate voltage generating section 45 is applied to the second control gate 2 of the nonvolatile memory device via the second local word line 67. Further, voltages generated by the first selection gate voltage generating section 46 and the drain voltage generating section 43 are respectively applied to the first selection gate 6 and the drain 7 via the first local selection line 72 and the bit line 66i. Further, a voltage generated by the source voltage generating section 48 is applied to the source 11 via the common source line 73.

Electric charges are injected into the charge storage layer 3 of the memory cell M3 of the nonvolatile memory device shown in FIG. 6 by an FN tunnel current in the following manner for the writing operation. First, a high voltage VH1 is applied to the first control gate 4, and a voltage VH2 (VH1>VH2) such as to prevent the writing is applied to the second control gate 2. A negative voltage VN1 such as to prevent electrical connection to the source 11 is applied to the first selection gate 6 of the first selection transistor N3. The source 11 is grounded, and a negative voltage VN1 is applied to the drain 7. For the other memory devices not subjected to the charge injection in the selected block, a positive voltage is applied to the drain 7 (bit line) of each of the memory devices, or the drain 7 is grounded for prevention of the writing.

By the application of the negative voltage VN1 to the drain 7, the N-type diffusion layers 8, 9, 10 are kept at the negative voltage VN1. Thus, the first floating channel 15 (FIG. 5) formed in a region of the island semiconductor layer 12 opposed to the charge storage layer 3 with the intervention of the insulation film is charged at the negative voltage VN1, whereby a potential difference of VH1−VN1 occurs between the first control gate 4 and the first floating channel 15 (FIG. 5). At this time, electric charges are injected into the charge storage layer 3 from the first floating channel 15 by the FN tunnel current. Thus, the threshold voltage of the memory cell M3 is positively shifted by the injection of the charges. However, the application of the negative voltage VN1 to the first selection gate 6 prevents electrical connection between the N-type diffusion layer 10 and the source 11, thereby preventing the flow of an excessive electric current from the source 11 to the drain 7 to which the negative voltage is applied. Since the electric charges are not injected into the charge storage layer 1 of the memory cell M4, the threshold voltage of the memory cell M4 is not changed. In this manner, the electric charges are injected into the charge storage layer 3 of each of the lower memory cells M3 in the selected block by the FN tunnel current for the writing operation.

On the other hand, electric charges are injected into the charge storage layer 1 of each of the upper memory cells M4 in the block in the following manner for the writing operation. A high voltage VH1 is applied to the second control gate 2, and a voltage VH2 (VH1>VH2) such as to prevent the writing is applied to the first control gate 4. A negative voltage VN1 such as to prevent electrical connection to the source 11 is applied to the first selection gate 6. The source 11 is grounded, and a negative voltage VN1 is applied to the drain 7. By the application of the negative voltage VN1 to the drain 7, the N-type diffusion layers 9, 10 are kept at the negative voltage VN1. Thus, the second floating channel 14 formed in a region of the island semiconductor layer 12 opposed to the charge storage layer 1 with the intervention of the insulation film is charged at the negative voltage VN1, whereby a potential difference of VH1–VN1 occurs between the second control gate 2 and the second floating channel 14. At this time, the electric charges are injected into the charge storage layer 1 from the second floating channel 14 by the tunnel current. Thus, the threshold voltage of the memory cell M4 is positively shifted by the injection of the charges. However, the application of the negative voltage VN1 to the first selection gate 6 prevents the electrical connection between the N-type diffusion layer 10 and the source 11, thereby preventing the flow of an excessive electric current from the source 11 to the drain 7 to which the negative voltage is applied. Since the electric charges are not injected into the charge storage layer 3 of the memory cell M3, the threshold voltage of the memory cell M3 is not changed. In this manner, the voltages are applied to the respective terminals for the writing operation.

Figure 38:
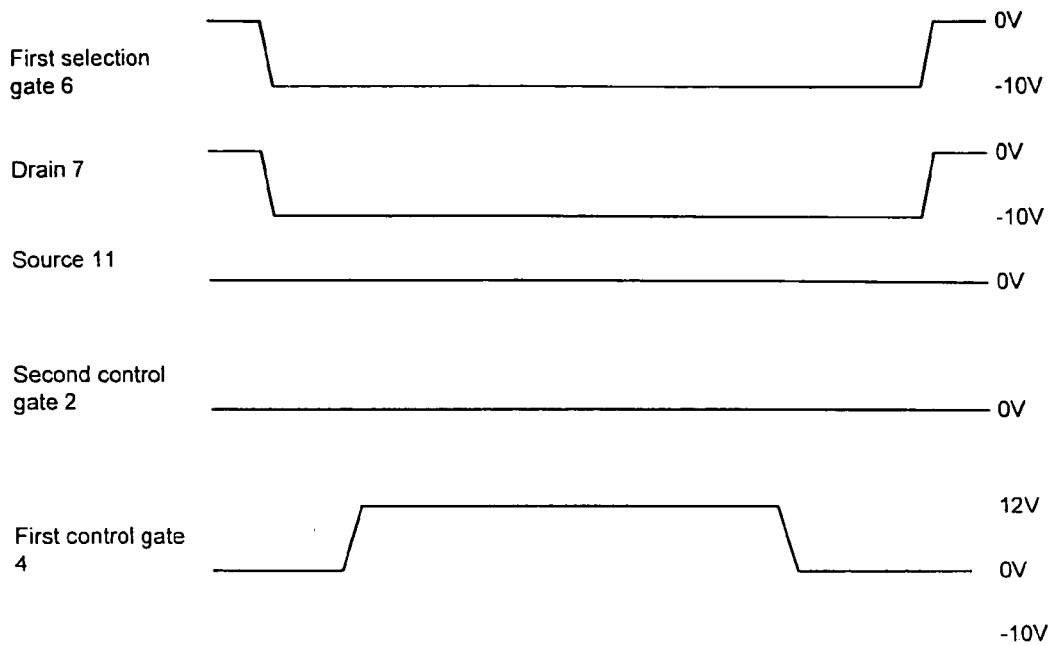
FIG. 38 is a timing chart for the application of the respective voltages in the exemplary process of the writing operation according to the present invention.
Figure 39:
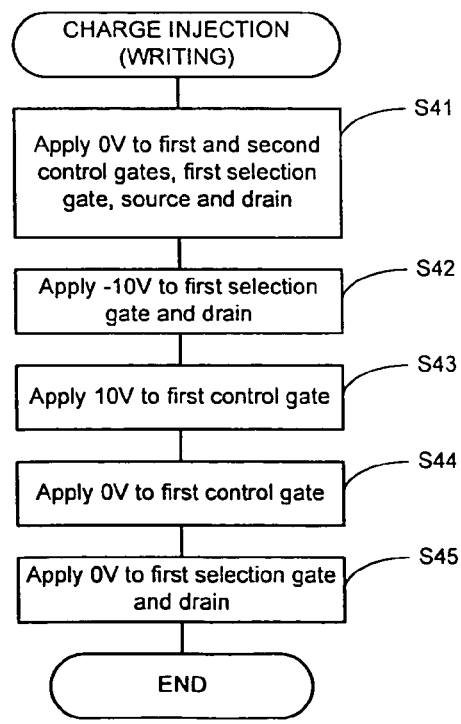
FIG. 39 is a flow chart for the exemplary process of the writing operation shown in FIG. 38.

An exemplary process for the writing operation will hereinafter be described. FIG. 38 is a timing chart for the application of the voltages to the respective terminals according to this embodiment. FIG. 39 is a flow chart for the process for the writing operation according to this embodiment. With reference to the flow chart of FIG. 39, an explanation will be given to the process for the writing operation on the memory cell.

First, 0V is applied to the first and second control gates 4, 2, the first selection gate 6, the source 11 and the drain 7 (Step S41). Then, –10V is applied to the drain 7 and the first selection gate 6 with the second control gate 2 being kept at 0V (Step S42). Thereafter, 10V is applied to the first control gate 4 (Step S43). For the other memory devices not subjected to the writing operation in the selected block, 0V is applied to the drain 7 (bit line) of each of the memory devices for prevention of the writing.

After the completion of the writing, 0V is applied to the first control gate 4 (Step S44). Then, 0V is applied to the first selection gate 6 and the drain 7 (Step S45). In this embodiment, the voltages applied to the first selection gate 6 and the drain 7 are simultaneously changed. However, these voltages are not necessarily required to be simultaneously changed, but may be changed in a time-staggered manner.

Sixth Embodiment

An explanation will be given to a fourth exemplary process for the erasing operation, in which electric charges are released in the nonvolatile memory device of the fifth embodiment.

Where electric charges are to be released from the charge storage layer of each of the nonvolatile memory devices in the selected block for the erasing operation, a preparatory operation is performed by applying a positive voltage VH5 to the drain 7, applying a positive voltage VH4 to the first control gate 4 and the second control gate 2, and grounding the source 11 and the first selection gate 6. Thus, the first control gate 4 and the second control gate 2 are turned on and the N-type diffusion layers 9, 10 are kept at VH5, whereby the first and second floating channels 15, 14 are charged at VH5. After the completion of the charging, the voltages applied to the first and second control gates 4, 2 are changed from the positive voltage VH4 to a negative voltage VN1 for the release of the electric charges, whereby a potential difference of VN1–VH5 occurs between the first control gate 4 and the first floating channel 15 and between the second control gate 2 and the second floating channel 14. At this time, the electric charges are released from the charge storage layers 3, 1 to the first and second floating channels 15, 14 by an FN tunnel current. Thus, the threshold voltages of the memory cells M3, M4 are negatively shifted by the release of the electric charges. In this manner, the fourth process for the erasing operation is performed.

Figure 40:
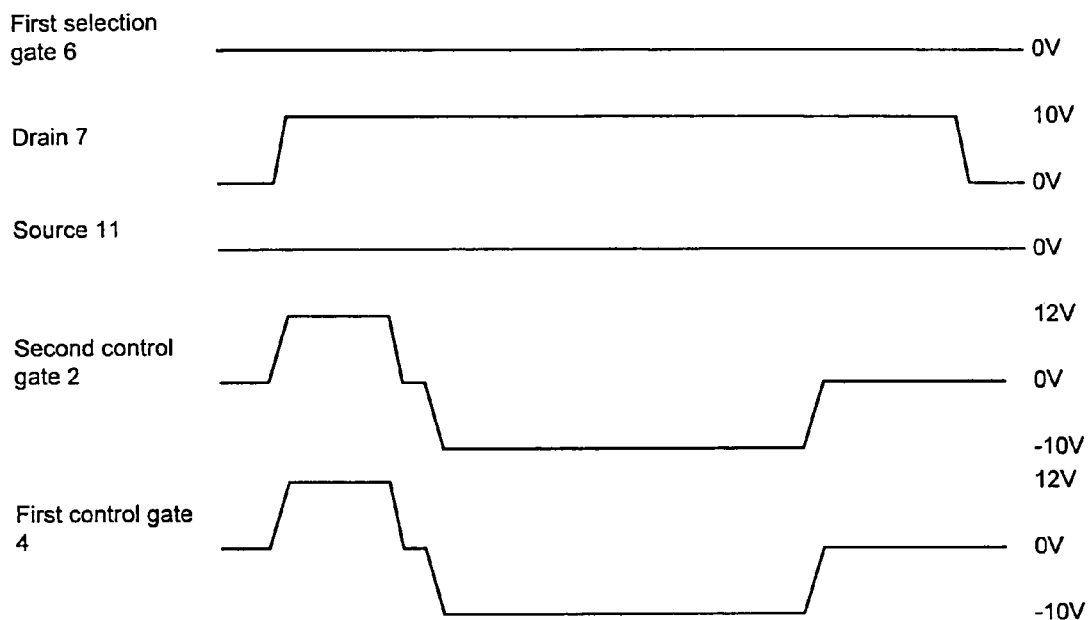
FIG. 40 is a timing chart for the application of the respective voltages in the fourth exemplary process of the erasing operation according to the present invention.
Figure 41:
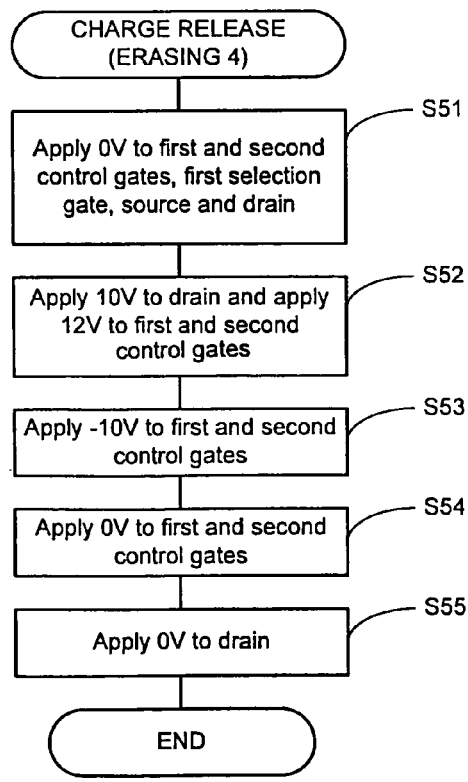
FIG. 41 is a flow chart for the fourth exemplary process of the erasing operation shown in FIG. 40.

The fourth process for the erasing operation will be described more specifically. FIG. 40 is a timing chart for the application of the voltages to the respective terminals according to this embodiment. FIG. 41 is a flow chart for the fourth process. Where the memory cells in the selected block are to be each subjected to the erasing operation, 0V is first applied to the first and second control gates 4, 2, the first selection gate 6, the source 11 and the drain 7 (Step S51). Then, 10V is applied to the drain 7, and 12V is applied to the first and second control gates 4, 2, whereby the first and second floating channels 15, 14 are charged (Step S52). After the completion of the charging, –10V is applied to the first and second control gates 4, 2 (Step S53). After the completion of the erasing, 0V is applied to the first and second control gates 4, 2 (Step S54). Thereafter, 0V is applied to the drain 7 (Step S55).

Further, an explanation will be given to a fifth exemplary process for the erasing operation in which electric charges are released from the charge storage layer of each of the memory cells in the selected block. For the release of the electric charges, a preparatory operation is performed by applying a positive voltage VH5 to the drain 7 and the source 11, applying a positive voltage VH4 (VH4>VH5) such as to permit passage of the positive voltage VH5 to the first selection gate 6, and applying a positive voltage VH4 to the first control gate 4 and the second control gate 2. Thus, the first selection gate 6, the first control gate 4 and the second control gate 2 are turned on and the N-type diffusion layers 9, 10 are kept at VH5, whereby the first and second floating channels 15, 14 are charged at VH5. After the completion of the charging, the voltages applied to the first and second control gates 4, 2 are changed from the positive voltage VH4 to a negative voltage VN1 for the release of the electric charges, whereby a potential difference of VN1–VH5 occurs between the first control gate 4 and the first floating channel 15 and between the second control gate 2 and the second floating channel 14. At this time, the electric charges are released from the charge storage layers 3, 1 to the first and second floating channels 15, 14 by a tunnel current. Thus, the threshold voltages of the memory cells M3, M4 are negatively shifted by the release of the electric charges.

Figure 42:
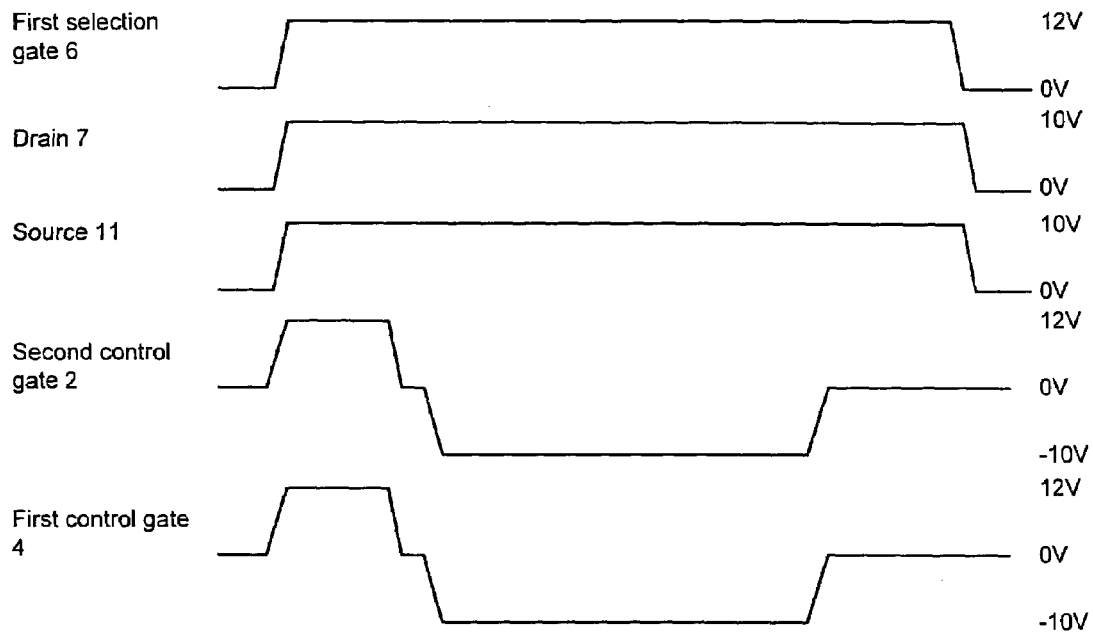
FIG. 42 is a timing chart for the application of the respective voltages in the fifth exemplary process of the erasing operation according to the present invention.
Figure 43:
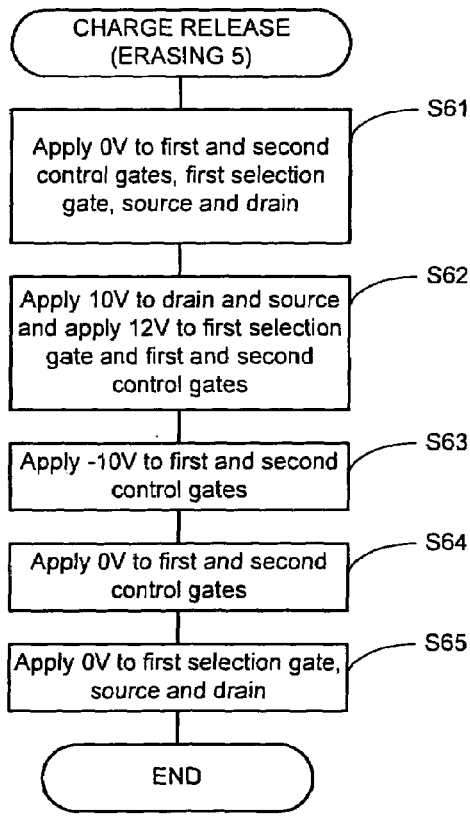
FIG. 43 is a flow chart for the fifth exemplary process of the erasing operation shown in FIG. 42.

The fifth process for the erasing operation will be described more specifically. FIG. 42 is a timing chart for the application of the voltages to the respective terminals in the fifth process. FIG. 43 is a flow chart for the fifth process. Where the memory cells in the selected block are to be each subjected to the erasing operation, 0V is first applied to the first and second control gates 4, 2, the first selection gate 6, the source 11 and the drain 7 (Step S61). Then, 10V is applied to the drain 7 and the source 11, and 12V is applied to the first selection gate 6 and the first and second control gates 4, 2, whereby the first and second floating channels 15, 14 are charged (Step S62). After the completion of the charging, –10V is applied to the first and second control gates 4, 2 (Step S63). After the completion of the erasing, 0V is applied to the first and second control gates 4, 2 (Step S64). Thereafter, 0V is applied to the first selection gate 6, the source 11 and the drain 7 (Step S65). In this manner, the erasing operation is performed on the memory cells M3, M4. In this process, the voltages applied to the first selection gate 6, the drain 7 and the source 11 are simultaneously changed.

However, these voltages are not necessarily required to be simultaneously changed, but may be changed in a time-staggered manner.

Seventh Embodiment

Figure 44:
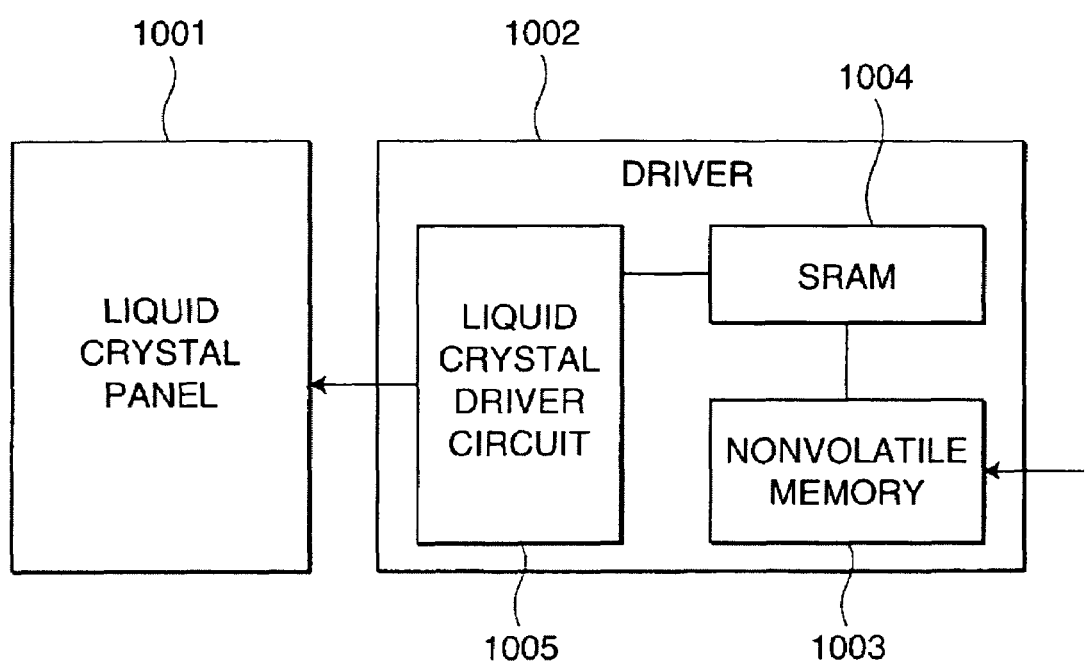
FIG. 44 is a schematic configuration diagram showing a liquid crystal display device (seventh embodiment) incorporating therein the semiconductor memory device according to the present invention.

The semiconductor storage devices described above are applicable to a rewritable nonvolatile memory for image adjustment in a liquid crystal panel of a liquid crystal display device as shown in FIG. 44.

The liquid crystal panel 1001 is driven by a liquid crystal driver 1002. The liquid crystal driver 1002 includes a nonvolatile memory section 1003, an SRAM section 1004 and a liquid crystal driver circuit 1005 provided therein. The nonvolatile memory section 1003 comprises any of the inventive nonvolatile memory devices, preferably the semiconductor storage device according to the second embodiment. The nonvolatile memory section 1003 is configured so as to be rewritable from the outside.

Information stored in the nonvolatile memory section 1003 is transferred to the SRAM section 1004 when the liquid crystal panel 1001 is turned on. The liquid crystal driver circuit 1005 is capable of reading the information out of the SRAM section 1004 as required. The provision of the SRAM section 1004 makes it possible to read out the information at a very high speed.

The liquid crystal driver 1002 is provided outside the liquid crystal panel 1001 as shown in FIG. 44, but may be provided on the liquid crystal panel 1001.

The liquid crystal panel 1001 is adapted to change the tones of pixels thereof by applying a multi-level voltage to each of the pixels. However, a relationship between the applied voltage and the tone varies from panel to panel. Therefore, information for compensation for the panel-to-panel variation is stored after the production of the liquid crystal panel, and a panel-to-panel variation in image quality is eliminated by the compensation based on the information. Therefore, it is preferred to incorporate the rewritable nonvolatile memory for storing the information for the compensation. Further, it is preferred to employ the inventive memory device, particularly the semiconductor storage device according to the second embodiment, as the nonvolatile memory.

In the inventive nonvolatile memory device driving method, the negative first voltage is applied to the drain for injecting electric charges to the charge storage layer of the nonvolatile memory device, while 0V or the positive third voltage is applied to the source and the negative first voltage is applied to the first selection gate. Therefore, the flow of the excessive electric current to the drain can be prevented without the need for the provision of the triple well structure which requires a complicated production process. In addition, the injection of the electric charges into the charge storage layer can be achieved without application of a higher voltage to the control gate. Therefore, the gate width and length of the transistor in the decoder or the booster circuit in the chip can be reduced, so that the area of the chip can be reduced.

Where the nonvolatile memory device driving method further comprises the steps of: applying the positive fifth voltage to the drain, applying the positive sixth voltage higher than the fifth voltage to the second selection gate and the control gate of the memory cell from which the electric charges are to be released, and applying 0V or the positive seventh voltage to the source and the first selection gate for precharging; and applying the negative eighth voltage to the control gate for releasing the electric charges after the prechargeing step, the release of the electric charges from the charge storage layer of the nonvolatile memory device for the erasing operation can be achieved by applying the negative eighth voltage to the control gate and applying the positive fifth voltage to the drain without applying a higher voltage to the control gate.

Alternatively, where the nonvolatile memory device driving method further comprises the steps of: applying the positive fifth voltage to the source, applying the positive sixth voltage higher than the fifth voltage to the first selection gate and the control gate of the memory cell from which the electric charges are to be released, and applying 0V or the positive seventh voltage to the drain and the second selection gate for precharging; and applying the negative eighth voltage to the control gate for releasing the electric charges after the precharging step, the release of the electric charges from the charge storage layer of the nonvolatile memory device for the erasing operation can be achieved by applying the negative eighth voltage to the control gate and applying the positive fifth voltage to the source without applying a higher voltage to the control gate.

Alternatively, where the nonvolatile memory device driving method further comprises the steps of: applying the positive fifth voltage to the drain and the source, and applying the positive sixth voltage higher than the positive fifth voltage to the first selection gate, the second selection gate and the control gate of the memory cell from which the electric charges are to be released for precharging; and applying the negative seventh voltage to the control gate for releasing the electric charges after the precharging step, the release of the electric charges from the charge storage layer can be achieved in a shorter period of time by applying the negative eighth voltage to the control gate and applying the positive fifth voltage to the drain and the source without applying a higher voltage to the control gate.

What is claimed is:

1. A method for driving a nonvolatile memory device comprising a semiconductor substrate, at least one island semiconductor layer provided on the semiconductor substrate, at least one memory cell having a control gate and a charge storage layer partly or entirely surrounding a peripheral surface of the island semiconductor layer, a first selection transistor provided between the memory cell and the semiconductor substrate and having a first insulation layer and a first selection gate, a source diffusion layer provided as a source between the semiconductor substrate and the island semiconductor layer provided with the memory cell and the first selection transistor for electrically isolating the island semiconductor layer from the semiconductor substrate, a drain diffusion layer provided as a drain in an end surface of the island semiconductor layer opposite from the source diffusion layer with respect to the memory cell, and a second selection transistor provided between the memory cell and the drain diffusion layer and having a second insulation layer and a second selection gate, the method comprising the steps of:
   applying a negative first voltage to the drain and the first selection gate, applying a positive second voltage to the second selection gate, and applying 0V or a positive third voltage to the source; and
   applying a positive fourth voltage higher than the second voltage to the control gate of the memory cell,
   whereby electric charges are injected into the charge storage layer.

2. A nonvolatile memory device driving method as set forth in claim 1, further comprising the steps of:
   applying a positive fifth voltage to the drain, applying a positive sixth voltage higher than the fifth voltage to the second selection gate and the control gate of the memory cell, and applying 0V or a positive seventh voltage to the source and the first selection gate for precharging; and applying a negative eighth voltage to the control gate for charge release after the prechargeing step, whereby the electric charges are released from the charge storage layer.

3. A nonvolatile memory device driving method as set forth in claim 1, further comprising the steps of:

applying a positive fifth voltage to the source, applying a positive sixth voltage higher than the fifth voltage to the first selection gate and the control gate of the memory cell, and applying 0V or a positive seventh voltage to the drain and the second selection gate for precharging; and applying a negative eighth voltage to the control gate for charge release after the precharging step, whereby the electric charges are released from the charge storage layer.

4. A nonvolatile memory device driving method as set forth in claim 1, further comprising the steps of:

applying a positive fifth voltage to the drain and the source, and applying a positive sixth voltage higher than the fifth voltage to the first selection gate, the second selection gate and the control gate of the memory cell for precharging; and applying a negative seventh voltage to the control gate for charge release after the precharging step, whereby the electric charges are released from the charge storage layer.

5. A method for driving a nonvolatile memory device comprising a semiconductor substrate, at least one island semiconductor layer provided on the semiconductor substrate, at least one memory cell having a control gate and a charge storage layer partly or entirely surrounding a peripheral surface of the island semiconductor layer, a selection transistor provided between the memory cell and the semiconductor substrate and having an insulation layer and a selection gate, a source diffusion layer provided as a source between the semiconductor substrate and the island semiconductor layer provided with the memory cell and the selection transistor for electrically isolating the island semiconductor layer from the semiconductor substrate, and a drain diffusion layer provided as a drain in an end surface of the island semiconductor layer opposite from the source diffusion layer with respect to the memory cell, the method comprising the steps of:

applying a negative first voltage to the drain and the selection gate, and applying 0V or a positive second voltage to the source; and applying a positive third voltage to the control gate of the memory cell, whereby electric charges are injected into the charge storage layer.

6. A nonvolatile memory device driving method as set forth in claim 5, further comprising the steps of:

applying a positive fourth voltage to the drain, applying a positive fifth voltage higher than the fourth voltage to the control gate of the memory cell, and applying 0V or a positive sixth voltage to the source and the selection gate for precharging; and applying a negative seventh voltage to the control gate for charge release after the prechargeing step, whereby the electric charges are released from the charge storage layer.

7. A nonvolatile memory device driving method as set forth in claim 5, further comprising the steps of:

applying a positive fourth voltage to the drain and the source, and applying a positive fifth voltage higher than the fourth voltage to the selection gate and the control gate of the memory cell for precharging; and applying a negative sixth voltage to the control gate for charge release after the precharging step, whereby the electric charges are released from the charge storage layer.

8. A semiconductor storage device comprising:

a nonvolatile memory device comprising a semiconductor substrate, at least one island semiconductor layer provided on the semiconductor substrate, at least one memory cell having a control gate and a charge storage layer partly or entirely surrounding a peripheral surface of the island semiconductor layer, a first selection transistor provided between the memory cell and the semiconductor substrate and having a first insulation layer and a first selection gate, a source diffusion layer provided as a source between the semiconductor substrate and the island semiconductor layer provided with the memory cell and the first selection transistor for electrically isolating the island semiconductor layer from the semiconductor substrate, a drain diffusion layer provided as a drain in an end surface of the island semiconductor layer opposite from the source diffusion layer with respect to the memory cell, and a second selection transistor provided between the memory cell and the drain diffusion layer and having a second insulation layer and a second selection gate;

a first voltage generating section which generates a voltage to be applied to the control gate;

a second voltage generating section which generates a voltage to be applied to the first selection gate;

a third voltage generating section which generates a voltage to be applied to the drain;

a fourth voltage generating section which generates a voltage to be applied to the source;

a fifth voltage generating section which generates a voltage to be applied to the second selection gate; and a state controlling section which controls the voltages generated by the first to fifth voltage generating sections and timing for the application of the voltages;

wherein the state controlling section controls the first to fifth voltage generating sections to cause the second voltage generating section and the third voltage generating section to generate a negative first voltage to apply the first voltage to the first selection gate and the drain, to cause the fifth voltage generating section to generate a positive second voltage to apply the second voltage to the second selection gate, to cause the fourth voltage generating section to generate 0V or a positive third voltage to apply 0V or the third voltage to the source, and to cause the first voltage generating section to generate a positive fourth voltage higher than the second voltage to apply the fourth voltage to the control gate of the memory cell for injecting electric charges into the charge storage layer.

9. A semiconductor storage device as set forth in claim 8, wherein the state controlling section controls the first to fifth voltage generating sections to cause the third voltage generating section to generate a positive fifth voltage to apply the fifth voltage to the drain, to cause the fifth voltage generating section and the first voltage generating section to generate a positive sixth voltage higher than the fifth voltage to apply the sixth voltage to the second selection gate and the control gate of the memory cell, to cause the fourth voltage generating section and the second voltage generating section to generate 0V or a positive seventh voltage to apply 0V or the seventh voltage to the source and the first selection gate, and then to cause the first voltage generating section to generate a negative eighth voltage to apply the eighth voltage to the control gate for releasing the electric charges from the charge storage layer.

10. A semiconductor storage device as set forth in claim 8, wherein the state controlling section controls the first to fifth voltage generating sections to cause the fourth voltage generating section to generate a positive fifth voltage to apply the fifth voltage to the source, to cause the second voltage generating section and the first voltage generating section to generate a positive sixth voltage higher than the fifth voltage to apply the sixth voltage to the first selection gate and the control gate of the memory cell, to cause the third voltage generating section and the fifth voltage generating section to generate 0V or a positive seventh voltage to apply 0V or the seventh voltage to the drain and the second selection gate, and then to cause the first voltage generating section to generate a negative eighth voltage to apply the eighth voltage to the control gate for releasing the electric charges from the charge storage layer.

11. A semiconductor storage device as set forth in claim 8, wherein the state controlling section controls the first to fifth voltage generating sections to cause the third voltage generating section and the fourth voltage generating section to generate a positive fifth voltage to apply the fifth voltage to the drain and the source, to cause the second voltage generating section, the fifth voltage generating section and the first voltage generating section to generate a positive sixth voltage higher than the fifth voltage to apply the sixth voltage to the first selection gate, the second selection gate and the control gate of the memory cell, and then to cause the first voltage generating section to generate a negative seventh voltage to apply the seventh voltage to the control gate for releasing the electric charges from the charge storage layer.

12. A liquid crystal display device comprising a semiconductor storage device as recited in claim 8.

* * * * *

UNITED STATES PATENT AND TRADEMARK OFFICE
CERTIFICATE OF CORRECTION

PATENT NO. : 7,009,888 B2  
APPLICATION NO. : 10/888693  
DATED : March 7, 2006  
INVENTOR(S) : Fujio Masuoka et al.

It is certified that error appears in the above-identified patent and that said Letters Patent is hereby corrected as shown below:

On the Title page, in section (73) Assignee:

Please replace "Sharp Kabushiki Kaisha, Osaka (JP)".

With the following:

-- Sharp Kabushiki Kaisha, Osaka (JP) --.
-- Fujio Masuoka, Sendai (JP) --.

Signed and Sealed this

Eighth Day of April, 2008

JON W. DUDAS  
*Director of the United States Patent and Trademark Office*